United States Patent
Huang

(10) Patent No.: US 8,247,945 B2
(45) Date of Patent: Aug. 21, 2012

(54) MICRO-ELECTRO-MECHANICAL TRANSDUCERS

(75) Inventor: Yongli Huang, San Jose, CA (US)

(73) Assignee: Kolo Technologies, Inc., San Jose, CA (US)

(*) Notice: Subject to any disclaimer, the term of this patent is extended or adjusted under 35 U.S.C. 154(b) by 809 days.

(21) Appl. No.: 11/914,597

(22) PCT Filed: May 18, 2006

(86) PCT No.: PCT/IB2006/051568
§ 371 (c)(1),
(2), (4) Date: Feb. 12, 2009

(87) PCT Pub. No.: WO2006/123300
PCT Pub. Date: Nov. 23, 2006

(65) Prior Publication Data
US 2009/0140606 A1    Jun. 4, 2009

Related U.S. Application Data

(60) Provisional application No. 60/744,242, filed on Apr. 4, 2006, provisional application No. 60/705,606, filed on Aug. 3, 2005, provisional application No. 60/692,038, filed on Jun. 17, 2005, provisional application No. 60/682,619, filed on May 18, 2005.

(51) Int. Cl.
*H02N 1/00* (2006.01)
*B41J 2/045* (2006.01)
*H01L 21/768* (2006.01)
*H04R 19/00* (2006.01)
*A61B 8/00* (2006.01)

(52) U.S. Cl. ........ 310/309; 600/459; 381/191; 367/181; 73/514.32

(58) Field of Classification Search .................. 310/309; 381/174, 191; 600/459, 437; 367/163, 181; 73/514.32
See application file for complete search history.

(56) References Cited

U.S. PATENT DOCUMENTS

| 2,975,307 A | 3/1961 | Schroeder et al. |
| 4,889,832 A | 12/1989 | Chatterjee |
| 5,055,731 A | 10/1991 | Nihei et al. |

(Continued)

FOREIGN PATENT DOCUMENTS

EP    1306901 A2    5/2003

(Continued)

OTHER PUBLICATIONS

Extended Europoean Search Report mailed on Feb. 18, 2011 for European Patent Application No. 06744966.0, a counterpart foreign application for U.S Appl. No. 11/914,584.

(Continued)

*Primary Examiner* — Karl Tamai
(74) *Attorney, Agent, or Firm* — Lee & Hayes, PLLC

(57) ABSTRACT

A micro-electro-mechanical transducer (such as a cMUT) is disclosed. The transducer has a substrate, a top plate, and a resilient structure therebetween. The resilient structure has multiple connectors distributed over the device element area to vertically transport the top player with distributed support. The resilient structure may be cantilevers formed using a middle spring layer covering cavities on the substrate. Connectors define a transducing space below the top plate. The resilient structure enables a vertical displacement of the connectors, which transports the top plate in a piston-like motion to change the transducing space and to effectuate energy transformation. No separate cells are necessary for each addressable transducer element. Multiple device elements can be made on the same substrate.

60 Claims, 14 Drawing Sheets

U.S. PATENT DOCUMENTS

| | | | |
|---|---|---|---|
| 5,894,452 | A | 4/1999 | Ladabaum et al. |
| 5,993,677 | A | 11/1999 | Biasse et al. |
| 6,002,117 | A | 12/1999 | Pak |
| 6,004,832 | A | 12/1999 | Haller et al. |
| 6,283,601 | B1 | 9/2001 | Hagelin et al. |
| 6,512,625 | B2 | 1/2003 | Mei et al. |
| 6,585,653 | B2 | 7/2003 | Miller |
| 6,600,587 | B2 | 7/2003 | Sniegowski et al. |
| 6,605,518 | B1 | 8/2003 | Ohmi et al. |
| 6,684,469 | B2 | 2/2004 | Horning et al. |
| 6,828,656 | B2 | 12/2004 | Forbes et al. |
| 6,865,140 | B2 | 3/2005 | Thomenius et al. |
| 7,052,464 | B2 | 5/2006 | Wodnicki |
| 7,564,172 | B1 | 7/2009 | Huang |
| 2002/0031294 | A1 | 3/2002 | Takeda et al. |
| 2002/0074670 | A1 | 6/2002 | Suga |
| 2003/0022475 | A1 | 1/2003 | Vieux-Rochaz et al. |
| 2003/0207566 | A1 | 11/2003 | Forbes et al. |
| 2003/0222354 | A1 | 12/2003 | Mastromatteo et al. |
| 2004/0027671 | A1 | 2/2004 | Wu et al. |
| 2004/0085858 | A1 | 5/2004 | Khuri-Yakub et al. |
| 2004/0106221 | A1 | 6/2004 | Hunter et al. |
| 2005/0046922 | A1 | 3/2005 | Lin et al. |
| 2005/0075572 | A1 | 4/2005 | Mills et al. |
| 2005/0168849 | A1 | 8/2005 | Lin |
| 2005/0237858 | A1 | 10/2005 | Thomenius et al. |
| 2006/0004289 | A1 | 1/2006 | Tian et al. |
| 2006/0125348 | A1 | 6/2006 | Smith et al. |
| 2008/0194053 | A1 | 8/2008 | Huang |
| 2008/0197751 | A1 | 8/2008 | Huang |
| 2008/0290756 | A1 | 11/2008 | Huang |
| 2009/0140606 | A1 | 6/2009 | Huang |

FOREIGN PATENT DOCUMENTS

| | | | |
|---|---|---|---|
| JP | 05047916 | | 2/1993 |
| JP | 2000508860 | | 7/2000 |
| JP | 2002076269 | | 3/2002 |
| JP | 2002191180 | | 7/2002 |
| JP | 2002250665 | | 9/2002 |
| JP | 2003017503 | | 1/2003 |
| JP | 2003151978 | | 5/2003 |
| JP | 2003526207 | | 9/2003 |
| JP | 2005078068 | | 3/2005 |
| JP | 2008541434 | | 11/2008 |
| WO | WO2004084300 | A1 | 9/2004 |
| WO | WO2005120130 | A1 | 12/2005 |

OTHER PUBLICATIONS

Translated Chinese Office Action mailed Mar. 23, 2011 for Chinese Patent Application No. 200680017137.1, a counterpart foreign application of U.S. Appl. No. 11/914,597.
Final Office Action for U.S. Appl. 11/917,666 mailed on Apr. 25, 2011, Yongli Huang, "Micro-Electro Mechanical Transducer Having an Insulation Extension".
Non-Final Office Action for U.S. Appl. 11/914,584 mailed on Apr. 25, 2011, Yongli Huang, "Through-Wafer Interconnection".
PCT International Search Report and Written Opinion for PCT Application No. PCT/IB06/51567, mailed on Jun. 5, 2008, 7 pgs.
PCT International Search Report and Written Opinion for PCT Application No. PCT/IB06/51568, mailed on Jun. 16, 2008, 7 pgs.
PCT International Search Report and Written Opinion for PCT Application No. PCT/IB06/51569, mailed on Jun. 18, 2008, 7 pgs.
PCT International Search Report and Written Opinion for PCT Application No. PCT/IB06/51948, mailed on Jul. 7, 2008, 9 pgs.
Chinese Office Action mailed Jun. 28, 2011 for Chinese patent application No. 200680025783.2, a counterpart foreign application of U.S. Appl. No. 11/914,584.
Translated Japanese Office Action mailed Jul. 8, 2011 for Japanese patent application No. 2008-511848, a counterpart foreign application of U.S. Appl. No. 11/914,597.
Office action for U.S. Appl. No. 11/914,608, mailed on Aug. 4, 2011, Huang, "Micro-Electro-Mechanical Transducers", 8 pages.
Chow et al, "Process Compatible Polysilicon-Based Electrical Through-Wafer Interconnects in Silicon Substrates," Journal of Electromechanical Systems, IEEE, vol. 11, No. 6, Dec. 2002, pp. 631-640.
Ergun et al, "Capacitive Micromachined Ultrasonic Transducers: Fabrication Technology," IEEE Transactions on Ultrasonics, Ferroelectrics, and Frequency Control, vol. 52, No. 12, Dec. 2005, pp. 2242-2258.
Huang et al, "Fabricating Capacitive Micromachined Ultrasonic Transducers with Wafer-Bonding Technology," Journal of Microelectromechanical Systems, IEEE, vol. 12, No. 2, Apr. 2003, pp. 128-137.
Jin et al, "Micromachined Capacitive Transducer Arrays for Medical Ultrasound Imaging," 1998 IEEE Ultrasonics Symposium, pp. 1877-1880.
Lemmerhirt et al, "Air-Isolated Through-Wafer Interconnects for Microsystem Applications," The 12th International Conference on Solid State Sensors, Actuators and Microsystems, IEEE, Jun. 6-12, 2003, pp. 1067-1070.
Jin et al, "Recent Progress in Capacitive Micromachined Ultrasonic Immersion Transducer Array," The 8th International Symposium on Integrated Circuits, Devices and Systems, Singapore, Sep. 8-10, 1999, pp. 159-162.
Khuri-Yakub et al, "Micromachined Ultrasonic Transducers and Their Use for 2D and 3D Imaging," Acoustical Imaging, Kluwer Academic Publishers, Netherlands, 2004, pp. 1-9.
Huang et al, "New Fabrication Process for Capacitive Micromachined Ultrasonic Transducers," IEEE, 2003, pp. 522-525.
Huang et al, "Capacitive Micromachined Ultrasonic Transducers (CMUTS) with Isolation Posts," 2004 IEEE International Ultrasonics, Ferroelectrics, and Frequency Control Joint 50th Anniversary Conference, pp. 2223-2226.
Huang et al, "Optimized Membrane Configuration Improves CMUT Performance," 2004 IEEE Ultrasonics Symposium, 2004 IEEE International Ultrasonics, Ferroelectrics, and Frequency Control Joint 50th Anniversary Conference, pp. 505-508.
Huang et al, "Capacitive Micromachined Ultrasonic Transducers (CMUTS) with Piston-Shaped Membranes," 2005 IEEE Ultrasonics Symposium, 2005, pp. 589-592.
Hwang et al, "Design and Fabrication of the Thin-Film Micromirror Array-actuated for Large Projection Displays," Journal of the Korean Physical Society, vol. 33, Nov. 1998, pp. S467-S470.
Kim et al, "A High Fill-Factor Micro-Mirror Stacked on a Crossbar Torsion Spring for Electrostatically-Actuated Two-Axis Operation in Large-Scale Optical Switch," IEEE, 2003, pp. 259-262.
Zhou et al, "Two-Axis Scanning Mirror for Free-Space Optical Communication between UAVs," IEEE/LEOS Optical MEMS 2003, Hawaii, US, Aug. 2003, pp. 1-2.
Hornbeck et al, "Digital Light Processing and MEMS: Timely Convergence for a Bright Future," DLP—Digital Light Processing, 1995, 25 pgs.
Jeon et al, "Electrostatic Digital Micromirror Using Interdigitated Cantilevers," IEEE, 2002, pp. 528-531.
Douglass et al, "Why is the Texas Instruments Digital Micromirror Device(TM) (DMD(TM)) so Reliable?", 1997, 7 pgs.
Chinese Office Action mailed Feb. 16, 2012 for Chinese patent application No. 200680017137.1, a counterpart foreign application of U.S. Appl. No. 11/914,597, 7 pages.
Translated Chinese Office Action mailed Nov. 14, 2011 for Chinese patent application No. 200680025783.2, a counterpart foreign application of U.S. Appl. No. 11/914,584, 11 pages.
Translated Chinese Office Action mailed Dec. 16, 2011 for Chinese patent application No. 200680021083.6, a counterpart foreign application of U.S. Appl. No. 11/917,666, 5 pages.
Translated Japanese Office Action mailed Oct. 21, 2011 for Japanese patent application No. 2008-516496, a counterpart foreign application of U.S. Appl. No. 11/917,666, 6 pages.
Japanese Office Action mailed May 18, 2012 for Japanese Patent Application No. 2008-511846, a counterpart foreign application of US Patent No. 8,105,941, 8 pages.

MICRO-ELECTRO-MECHANICAL TRANSDUCERS

RELATED APPLICATIONS

This application is a national stage application of international patent application PCT/IB2006/051568, claiming priority from U.S. Provisional Application Ser. No. 60/682,619, filed May 18, 2005; Ser. No. 60/692,038, filed Jun. 17, 2005; Ser. No. 60/705,606, filed Aug. 3, 2005; and Ser. No. 60/744,242, filed Apr. 4, 2006, which applications are incorporated herein by reference in their entirety.

This application further incorporates herein by reference in entirety the following:

International Application (PCT) PCT/IB2006/051566, entitled THROUGH-WAFER INTERCONNECTION, filed on May 18, 2006;

International Application (PCT), PCT/IB2006/051567, entitled METHODS FOR FABRICATING MICRO-ELECTRO-MECHANICAL DEVICES, filed on May 18, 2006; and International Application (PCT), PCT/IB2006/051569, entitled MICRO-ELECTRO-MECHANICAL TRANSDUCERS, filed on May 18, 2006.

FIELD OF THE INVENTION

The present invention relates to micro-electro-mechanical devices that have a movable mechanical part for energy transformation, particularly to micromachined ultrasonic transducers (MUT) such as capacitance micromachined ultrasonic transducers (cMUT).

BACKGROUND OF THE INVENTION

Micro-electro-mechanical transducers usually share a common feature which includes a movable mechanical part used for energy transformation. One example of such micro-electro-mechanical transducers is micromachined ultrasonic transducers (MUT). An ultrasound transducer performs a chain of energy transformation to realize its function of a transducer. In its receiving mode, the acoustic energy of ultrasound waves propagating in a medium where the transducer is placed is transformed to mechanical energy of a movable part (conventionally a vibrating membrane) in the transducer. The motion of the movable part is then transformed to a detectable electromagnetic (usually electrical) signal. In its transmitter mode, the reverse chain of energy transformation takes place.

Various types of ultrasonic transducers have been developed for transmitting and receiving ultrasound waves. Ultrasonic transducers can operate in a variety of media including liquids, solids and gas. These transducers are commonly used for medical imaging for diagnostics and therapy, biochemical imaging, non-destructive evaluation of materials, sonar, communication, proximity sensors, gas flow measurements, in-situ process monitoring, acoustic microscopy, underwater sensing and imaging, and many others. In addition to discrete ultrasound transducers, ultrasound transducer arrays containing multiple transducers have been also developed. For example, two-dimensional arrays of ultrasound transducers are developed for imaging applications.

Compared to the widely used piezoelectric (PZT) ultrasound transducer, the MUT has advantages in device fabrication method, bandwidth and operation temperature. For example, making arrays of conventional PZT transducers involves dicing and connecting individual piezoelectric elements. This process is fraught with difficulties and high expenses, not to mention the large input impedance mismatch problem presented by such elements to transmit/receiving electronics. In comparison, the micromachining techniques used in fabricating MUTs are much more capable in making such arrays. In terms of performance, the MUT demonstrates a dynamic performance comparable to that of PZT transducers. For these reasons, the MUT is becoming an attractive alternative to the piezoelectric (PZT) ultrasound transducers.

Among the several types of MUTs, the capacitive micromachined ultrasonic transducer (cMUT), which uses electrostatic transducers, is widely used. Other MUTs using piezoelectric (pMUT) and magnetic (mMUT) transducers are also adopted. Examples of prior art cMUT structure are shown in FIGS. 1A-1C, FIGS. 2-3, and FIGS. 4A-4B.

FIG. 1A shows a cross-sectional view of a basic structure of a prior art cMUT having multiple cells. FIG. 1B shows an enlarged view of a single cMUT cell 10. FIG. 1C shows a corresponding schematic top view of the same prior art multi-cell cMUT structure. In practice, a functional cMUT may have at least one independently addressable cMUT element. Based on the conventional design, each cMUT element consists of many cMUT cells which are connected in parallel. Four cells are shown in FIG. 1A, a single cell is shown in FIG. 1B, and ten cells are shown in FIG. 1C, but all cells belong to a single cMUT element in FIGS. 1A-1C.

The cMUT of FIGS. 1A-1C is built on a substrate 11. As shown in a selected cMUT cell 10, each cMUT cell has a parallel plate capacitor consisting of a rigid bottom electrode 12 and a top electrode 14 residing on or within a flexible membrane 16 that is used to transmit or receive an acoustic wave in the adjacent medium. The flexible membrane 16 in each cell is supported by the insulation wall or posts 18. The membrane 16 is spaced from the substrate 11 and the top electrode 12 to define a transducing space 19 therebetween. A DC bias voltage is applied between the electrodes 12 and 14 to deflect the membrane 16 to an optimal position for cMUT operation, usually with the goal of maximizing sensitivity and bandwidth. During transmission an AC signal is applied to the transducer. The alternating electrostatic force between the top electrode and the bottom electrode actuates the membrane 16 in order to deliver acoustic energy into the medium (not shown) surrounding the cMUT. During reception the impinging acoustic wave vibrates the membrane 16, thus altering the capacitance between the two electrodes. An electronic circuit detects this capacitance change.

Alternatively the membrane can be actuated and the displacement of the membranes detected using a piezoelectric transducer (pMUT) and a magnetic transducer (mMUT). FIG. 2 shows a pMUT cell 20 which has a similar structure to the cMUT cell 10 except that the capacitor (electrodes 12 and 14) are replaced by a piezoelectric member 24 on the membrane 26. FIG. 3 shows a mMUT cell 30 which has a similar structure to the cMUT cell 10 except that the capacitor (electrodes 12 and 14) are replaced by a magnetic member 34 on the membrane 36.

Methods of fabrication for making a cMUT shown in FIGS. 1A-1C have been developed. Exemplary methods are disclosed in U.S. Pat. Nos. 6,632,178 and 6, 958, 255.

There are drawbacks in the cMUTs of the prior art structures and methods. Many of these drawbacks relate to the fact that each addressable cMUT element is made of many individual cells and each cell has its cMUT membrane clamped or fixed on edges shared by the adjacent cells. Examples of the drawbacks are listed below.

(1) The average displacement of the membranes is small because of the clamped edges. As a result both the device transmission and reception performance are poor.

(2) Surface areas occupied by the clamped areas (e.g., edges) and the walls or posts are non-active, thus reducing the device fill factor and the overall efficiency.

(3) Anchor areas introduce a parasitic capacitance which decreases the device sensitivity.

(4) The anchor pattern within the surface of the cMUT element may cause ultrasonic wave interference which limits the device bandwidth.

(5) The non-uniform displacement of the membrane may disturb the ultrasonic wave pattern. For example, the non-uniform displacement may affect the ultrasonic beam pattern emitted from the transducer surface and also cause acoustic cross coupling through the transducer surface.

(6) The resonant frequencies of individual cells in the same cMUT element may be different between each other because of the process variation. This causes phase differences of the membrane motion among different cells in the same cMUT element during operation. As a result, the sum of the average displacement of the cMUT element may degrade dramatically. This problem degrades the device performance especially when the cMUT works in a high quality factor (Q-factor) condition, for example in air.

(7) The acoustic energy can couple into the transducer substrate through supporting walls and cause undesired effects such as acoustic cross coupling between the cMUT elements. An effort to reduce the cross-coupling through the substrate by introducing materials with desired acoustic properties may require occupation of extra space between elements.

The above problems also exist in the pMUT and mMUT of the prior art since they have a similar structure as the cMUT as shown in FIG. 1.

Another cMUT device having a compliant support structure built on the substrate to support the membrane is disclosed in the U.S. Pat. No. 7,030,536. A cMUT according to that design is shown in FIGS. 4A-4B. FIG. 4A shows cross-sectional view of a single cMUT cell 40 as disclosed in that patent. FIG. 4B shows the schematic top view of multiple cMUT cells as disclosed in that patent. Compared to the conventional cMUT structure shown in FIGS. 1A-1C, the cMUT structure disclosed in U.S. Pat. No. 7,030,536 uses a compliant support structure 48 in place of the conventional insulation wall 18 to define the perimeter ends of the membrane 46 of each cMUT cell 40, such that the top electrode 44 and the membrane 46 may move in a piston-like manner. This has potential advantages but the design according to the patent also introduces its own problems, as will be discussed in view of the present invention in the detailed description.

Due to the importance of these MUT devices, it is desirable to improve the technology in terms of performance, functionality, and manufacturability.

SUMMARY OF THE INVENTION

This application discloses a micro-electro-mechanical transducer (such as a cMUT) that has a movable mechanical part to transform energy. The transducer has a substrate, a top plate, and a resilient structure therebetween. The resilient structure has multiple connectors distributed over the device element area to vertically transport the top player with distributed support not limited to edges. The resilient structure may be cantilevers, or cantilever-containing structures such as bridges or crossbars, formed using a middle spring layer covering cavities on the substrate. Connectors define a transducing space below the top plate. The resilient structure such as cantilevers enable a vertical displacement of the connectors, which transports the top plate in a piston-like motion to change the transducing space and to effectuate energy transformation. No separate cells are necessary for each addressable transducer element. Multiple device elements can be made on the same substrate.

According to one aspect of the invention, a micro-electro-mechanical transducer is characterized in that:

(a) the resilient structure has a lower portion connecting to the substrate and an upper portion connecting to the top plate layer;

(b) the upper portion of the resilient structure has a plurality of connectors connecting to the top plate layer;

(c) the plurality of connectors are distributed over the device element area and have at least one connector located substantially away from the device element periphery toward an inner region of the device element area;

(d) a transducing space is defined below the top plate layer;

(e) the addressable device element has at least one transducing member to induce energy transformation; and (f) the resilient structure enables a vertical displacement of the plurality of connectors to transport the top plate layer in a substantially vertical direction, thus changing the transducing space and activating the transducing member.

In one embodiment, the resilient structure has a middle spring layer placed over the substrate. The middle spring layer and the substrate define at least one cavity inside the device element area. The cavity divides the device element area into at least two opposing sides, at least one side having an anchor anchoring the middle spring layer. The plurality of connectors are each horizontally distanced from the anchor by a sufficient length to define a cantilever or a bridge between the connector and the anchor. In this embodiment, each connector may have a desired height and stand from the top of the middle spring layer to separate the top plate from the middle spring layer to define the transducing space below the top plate layer.

In one preferred embodiment, the substrate and the middle spring layer define a plurality of cavities dividing the device element area into segments each substantially smaller than the device element area. Multiple cantilevers or bridges may be defined over the plurality of cavities to provide a distributed support to the top plate layer.

In one embodiment, the cavities and the corresponding anchors together occupy at least half the device element area. Within the device element area the middle spring layer may be a contiguous layer covering the top surface of the anchor. In one embodiment, the contiguous middle spring layer covers at least half of the device element area, and preferably the contiguous middle spring layer covers substantially the entire device element area.

In one embodiment, the cavity has an annular shape dividing the substrate wafer into an inner island and an outer region, and the inner island constitutes the anchor. The anchor may include a first anchor comprising the inner island and an opposing second anchor comprising the outer region.

In one embodiment the cavity comprises a first plurality of extended cavities forming a pattern of cavities and anchors on the substrate wafer. Various patterns may be formed.

The cantilevers may be of a variety of formations. For example, the cavity may be defined by at least two anchors opposing each other, and the middle spring layer within the device element area may connect to both opposing anchors. The connector may be located between the two opposing anchors and horizontally distanced from each of the two opposing anchors by a sufficient length to define two cantilevers connected head-to-head at a location where the connector is positioned. For another example, the anchor may define a circular sidewall surrounding the cavity, the middle spring layer may cover the entire cavity, and the connector may be at a position directly above a middle area of the cavity to define a two-dimensional plane cantilever.

One aspect of the invention is a micro-electro-mechanical transducer wherein the middle spring layer has a plurality of connectors connecting to the top plate layer. The plurality of connectors is distributed across the device element area to define a connector density profile having an average connector density per area location. Each cantilever thus formed has a spring strength, which when combined with the respective average connector density defines an effective spring intensity profile in which the effective spring intensity is the spring strength per area location. The effective spring intensity may either be substantially uniform over the device element area or have a nonuniform distribution profile. For example, the effective spring intensity may be significantly higher at area locations near a center of the device element area than locations near a perimeter of the device element area.

In one embodiment having multiple connectors, the device element area comprises two regions having different thicknesses of the top plate layer and different spring intensities. For example, a first region may have a greater thickness of the top plate layer and great effective spring intensity than the second region, or vice versa. In another embodiment the device element area comprises a perimeter surrounding a middle region, wherein the top plate layer is flexible near the parameter but rigid in the middle region, clamped at a perimeter sidewall and supported by at least one cantilever in the middle region.

The micro-electro-mechanical transducer may have additional characteristics. For example, the addressable device element the top plate layer may have a thickness profile having at least two different thicknesses across the device element area. The two different thicknesses may comprise a first thickness corresponding to a normal thickness of the top plate layer and a second thickness corresponding to a bottom thickness of a cavity formed on the top plate layer, the first thickness and the second thickness regularly alternating across the device element area. For another example, the addressable device element the top plate layer may comprise a first material and a second material different from the first material. In one embodiment, the first material has a plurality of segments divided by separation trenches and the second material spans over the segments to connect the segments of the first material. The second material may also at least partially fill the separation trenches.

In one embodiment, the micro-electro-mechanical transducer is a capacitance micromachined ultrasonic transducer (cMUT), wherein each addressable device element has a top electrode on the top plate layer and a bottom electrode on either the middle spring layer or the substrate wafer. Example, the middle spring layer may comprise a conductive material to effectuate as the bottom electrode. Alternatively, the top electrode may be a separate conductive layer deposited on the top plate layer.

In another embodiment, the micro-electro-mechanical transducer has a plurality of addressable device elements, which may be separated by a separation trench formed through at least part of the top plate layer. The substrate wafer may be a conductive wafer, and the addressable device element is insulated by an embedded insulator formed on the substrate wafer. The embedded insulator comprises an insulation cavity having a desired overall thickness and being filled with a dielectric material. Alternatively, the addressable device element is insulated by an embedded insulator formed on the substrate wafer, the embedded insulator comprising a patterned cavity containing solid lines of oxidized native material of the substrate wafer. The embedded insulator may also be formed on the top plate layer.

In one embodiment, the addressable device element is addressed from the back side of the substrate wafer via a through-wafer interconnect formed through the substrate wafer. For example, a conductive substrate wafer may be used, and the through-wafer interconnect may include an annular trench surrounding a through-wafer conductor made of a native material of the conductive wafer. A dielectric material may be used to fill the annular trench to insulate the through-wafer conductor from the rest of the substrate wafer. In one particular configuration, the through-wafer conductor is positioned directly underneath the addressable device element.

The micro-electro-mechanical transducer may also be a pMUT, wherein the transducing member comprises a piezoelectric member disposed on the middle spring layer or the top plate layer. The micro-electro-mechanical transducer may also be a mMUT, wherein the transducing member comprises a magnetic member disposed on the middle spring layer or the top plate layer.

The performance of the micro-electro-mechanical transducer may be enhanced by careful selection of the top plate material or configuration. For example, the top plate layer may have holes formed therethrough. The holes may have a size and location profile that optimizes a rigidity/mass ratio of the top plate layer. Furthermore, in order to avoid electric shorting problem, the maximum vertical displacement of the connector may be limited to be no greater than, preferably less than, the height of the transducing space between the top plate layer and the top surface of the anchor including any intervening layer. In one embodiment, the maximum vertical displacement of the connector is limited by a motion stopper disposed in the cavity.

According to another aspect of the invention, a micromachined ultrasonic transducer (MUT) structure has a substrate wafer, a middle spring layer and the top plate layer arranged in that order such that a bottom side of the top plate layer faces a top side of the middle spring layer and a bottom side of the middle spring layer faces a front side of the substrate wafer. The MUT structure comprises a plurality of addressable MUT elements each defined by a MUT element area of the substrate wafer and a corresponding MUT element area of the top plate layer. Each of the plurality of addressable MUT element has a transducing member and is further characterized in that:

(a) the device element area has at least one cavity between the substrate and the middle spring layer, each cavity being sidewalled by at least one anchor anchoring the middle spring layer;

(b) the middle spring layer covers at least a part of each cavity;

(c) at least one connector of a desired height disposed above each cavity, the connector standing from the top of the middle spring layer;

(d) the top plate is placed over the connector(s) to define a transducing space below the top plate layer;

(e) each connector is horizontally distanced from one of the at least one anchor by a sufficient length to define a cantilever between the connector and the anchor, wherein the cantilever and the cavity enable a vertical displacement of the connector to transport the top plate layer substantially vertically with a piston-like motion, thus changing the transducing space and activating the transducing member; and (f) the at least one cavity and the corresponding anchor(s) occupy at least half of the MUT element area.

The MUT structure may have additional features as summarized in above.

The foregoing and other features and advantages will become more apparent from the following detailed description of several embodiments, which proceeds with reference to the accompanying figures.

DETAILED DESCRIPTION

Figure 1A:
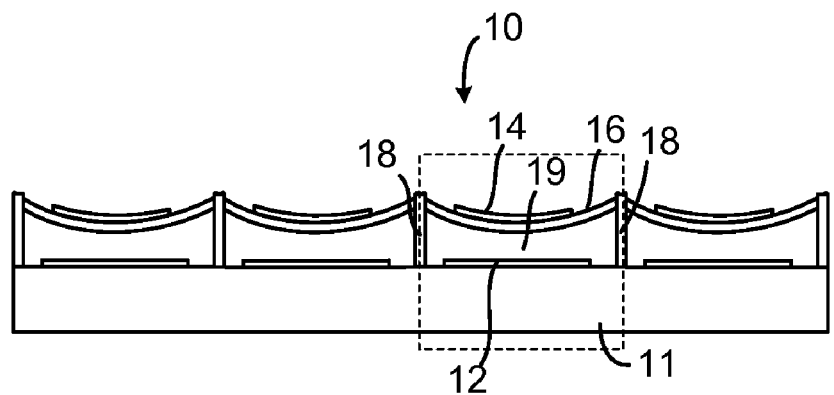
FIG. 1A shows a cross-sectional view of a basic structure of a prior art cMUT having multiple cells.

The micro-electro-mechanical transducer such as a capacitance micromachined ultrasonic transducer (cMUT) of the present invention will be described in detail along with the figures, in which like parts are denoted with like reference numerals or letters. The micro-electro-mechanical transducer may be fabricated using any suitable methods, particularly using the methods disclosed in several other patent applications identified herein, which are filed by a common applicant on even date.

The invention has been described below with reference to specific embodiments. In most cases, a cMUT structure is used to illustrate the invention. It is appreciated, however, that the present invention is not limited to cMUTs. It will be apparent to those skilled in the art that various modifications may be made and other embodiments can be used without departing from the broader scope of the inventions. Therefore, these and other variations upon the specific embodiments are intended to be covered by the present inventions. Those skilled in the art will recognize that various features disclosed in connection with the embodiments may be used either individually or jointly.

It is noted that the terms "transducer" and "transducing member" are used in a broad sense in this document to not only include devices that perform both actuation and sensing functions but also include devices that perform either an actuation function or an sensing function. It is also noted that the term "cantilever" is used in this description in a broad sense to describe a structure that has an anchored end, a resilient portion extending from the anchored, and to an exerting end to activate or move the resilient portion. A cantilever thus does not necessarily suggest a literal one-dimensional bema-like cantilever, but also includes similar structures have multibeams extending in different directions such as a bridge, or a crossbar, and most definitely also includes area or plane springs (two-dimensional "cantilevers") in which the anchored end is an extended line which may be a closed perimeter of an area or a portion thereof, the resilient portion is an extended area, and the exerting end may be a single point, a small area, or an extended line (close ended, open-ended, or segmented). In addition, the words "circular" and "annular" only suggest in the broadest sense that a shape has a looped form, a curved shape that is nearly looped, or an arrangement that is generally shaped like a ring, and do not suggest a rounded shape or any other shape in particular, nor does it suggest that the loop or ring is entirely complete or unbroken.

In order to illustrate the present invention, certain aspects of the designs according to the prior art are first discussed in light of the present invention. It is noted that the discussion herein casts a hindsight on the prior art designs in light of the present invention for the purpose of clearer illustration.

Figure 4A:
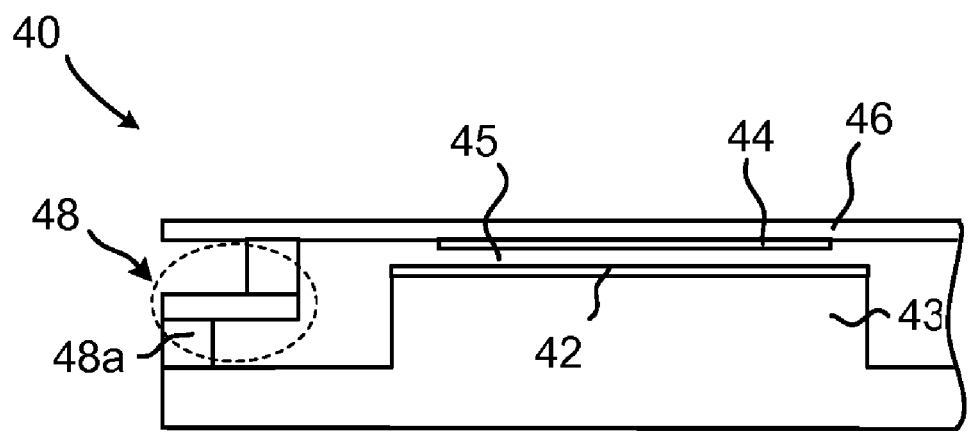
FIG. 4A shows cross-sectional view of another broiled single cMUT cell.
Figure 4B:
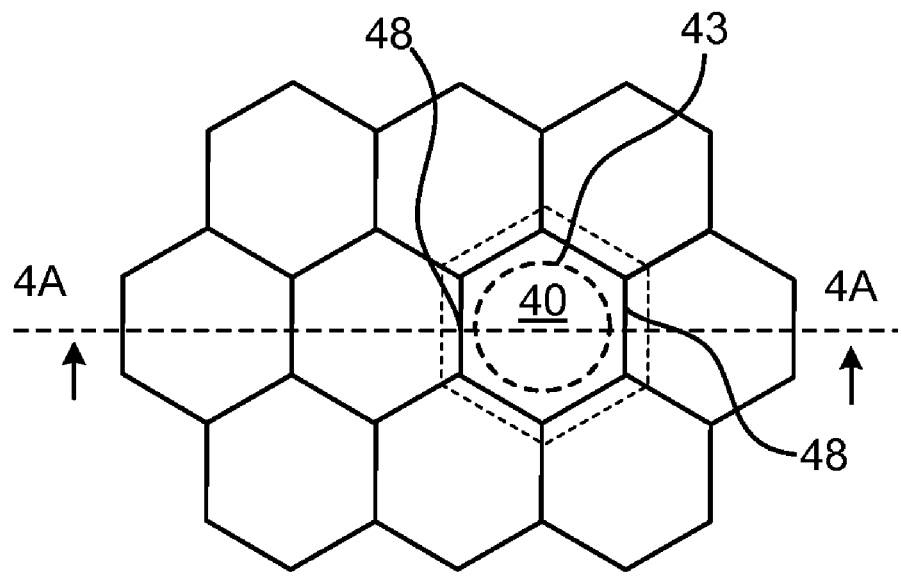
FIG. 4B shows a corresponding schematic top view of multiple cMUT cells of FIG. 4A.

Referring to FIGS. 4A and 4B, a prior art cMUT design is shown to use a compliant support structure 48 in place of the conventional insulation wall 18 to define the perimeter ends of the membrane 46 for each cMUT cell 40, such that the top electrode 44 and the membrane 46 may move in a piston-like manner through the space 45 between the bottom electrode 42 and the top electrode 44. The top electrode 44 is attached to bottom of the membrane 46. The bottom electrode 42 sits on top of a pedestal 43. In each cMUT cell, the membrane 46 is fixed to the compliant support structure 48 which is essentially a sealed sidewall to constitute the perimeter 48 (FIG. 4B) of each cMUT cell 40 the same way as the fixed membrane-based cMUT design showing in FIGS. 1A-1C. This is better seen in the context of the multi-cell structure shown in FIG. 4B.

The above design has potential advantages but also introduces its own problems. First, it should be noted that the concept of the prior art cMUT design shown in FIGS. 4A-4B is to replace the conventional rigid cell sidewall 18 using a compliant cell sidewall 48 made of compliant support structures. Because a relatively complex compliant cell sidewall 48 takes the place of the simple and narrow insulation wall 18 in FIG. 1, there would be a heightened challenge to minimize the impact of the inactive areas occupied by these peripheral compliant cell sidewalls 48 according to that design. It has been suggested that supplemental electrodes be made on the compliant support structures in the compliant cell sidewall 48 to reduce the inactive areas occupied by the compliant support structures. There is however no indication that such a design would solve the problem, and further no indication whether the design is practical from a fabrication point of view.

Figure 1B:
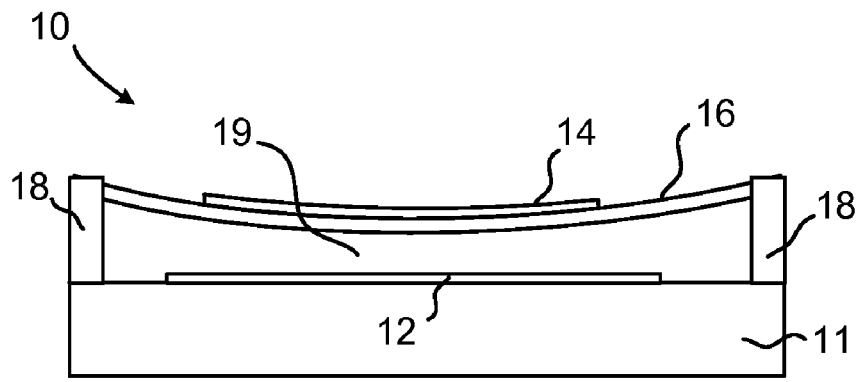
FIG. 1B shows an enlarged view of a single cMUT cell of FIG. 1A.
Figure 1C:
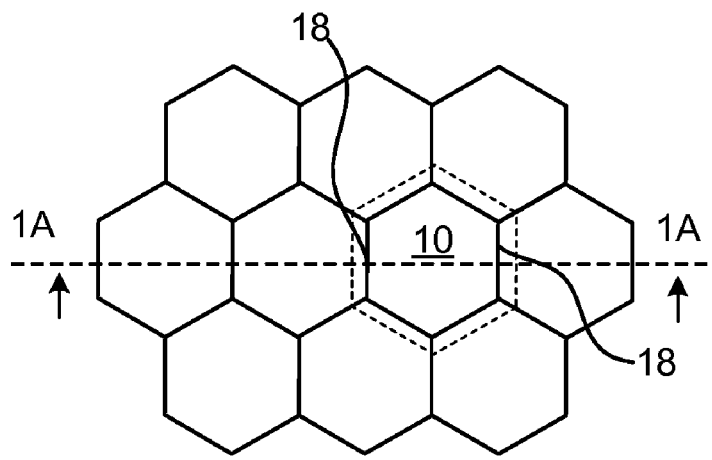
FIG. 1C shows a corresponding schematic top view of the same prior art multi-cell cMUT structure.
Figure 2:
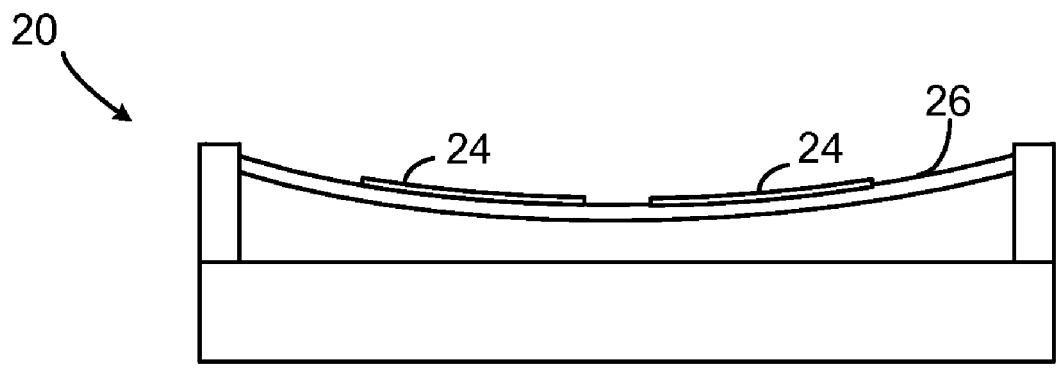
FIG. 2 shows a prior art pMUT cell.
Figure 3:
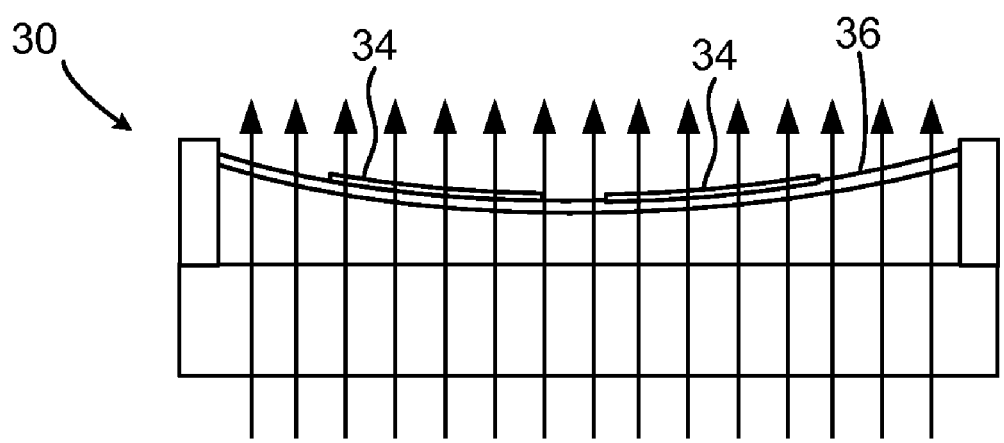
FIG. 3 shows a prior art mMUT cell.

Second, the compliant cell sidewall 48 defines the boundary in the overall cMUT structure, as shown in FIG. 4B. The vast majority area of the cMUT cell 40 is therefore occupied by a rigid and nonmovable pedestal 43, which is surrounded by (but separated from) the peripheral compliant cell sidewall 48. The compliant cell sidewall 48 on the edge is the sole structure to support the entire membrane 46 in the cell 40. This retains the same cell limitation that exists in the design of the cMUT showing in FIGS. 1A-1C. For example, it limits the overall size of each single cMUT cell 40. A large cMUT cell would require a large membrane 46, which would have to be very rigid and thick in order to maintain the required resonant frequency. This is one of the most important limitations of the conventional cMUT structure, because of which each addressable cMUT element must be made of multi-cells. For example, in a cMUT structure used in medical phase array, the cMUT element size is the half wavelength of the acoustic wave (e.g., 75 um for a 10 MHz device, 150 um for a 5 MHz device and 750 um for a 1 MHz device). In order to achieve the required device operation frequency, the size of the conventional cMUT cells must be made much smaller than the element or device size without having to use an unreasonably thick membrane. Due to its inherent design concept, the cMUT shown in FIGS. 4A and 4B is likely to behave quite similar to the other cMUT structures in this respect and therefore does not promise solve the related problems. In fact, it was envisioned that multiple small cells similar to what is found in the cMUT structures shown in FIGS. 1A-1C are used for the cMUT structures in FIGS. 4A and 4B.

The present invention is envisioned to do away with the cMUT cell requirement. As will be shown next, although the present invention may still be used to fabricate cMUT elements each having multiple cells, it does not have to be. In fact, due to the inherent characteristics of the cMUT design in accordance with the present invention, it may be preferable from a fabrication point of view to make each addressable cMUT element without any internal cell boundaries. In addition, even when an addressable cMUT element in accordance with the present invention is made of multiple smaller segments (such as areas each having its own top plate layer segment and middle spring layer segment separated from that of others), these smaller segments do not need to have a clamped perimeter or a peripheral support wall, and further do not need to be identical to each other in size or shape.

Figure 5A:
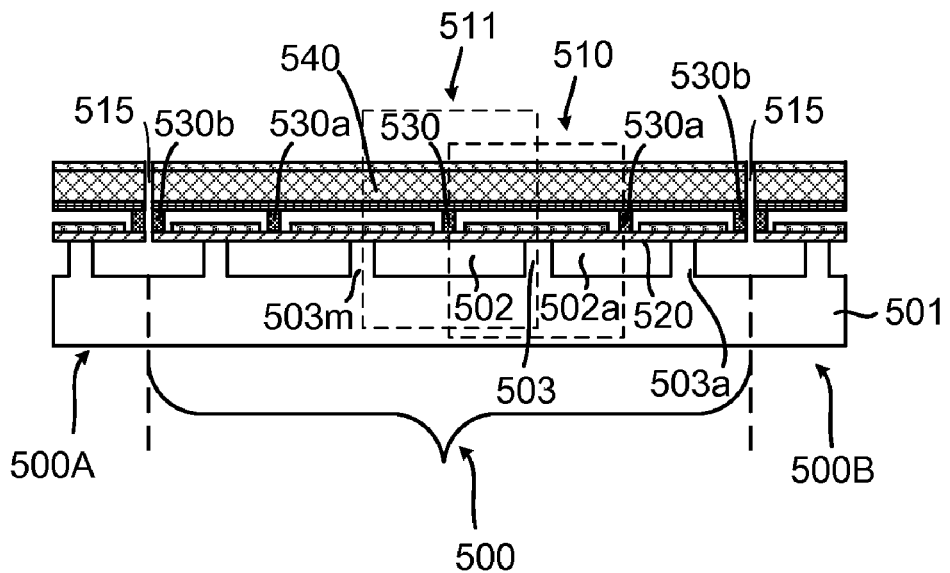
FIG. 5A shows a cross-section view of a cMUT structure in accordance with the present invention showing a complete cMUT element and parts of neighboring cMUT elements.

FIG. 5A is a cross-section view of a cMUT structure showing a complete cMUT element 500 and parts of neighboring cMUT elements 500A and 500B, one on each side. The cMUT structure is built on a substrate wafer 501 and also has a middle spring layer 520 and a top plate 540. The substrate wafer 501, the middle spring layer 520 and the top plate layer 540 are arranged from bottom to top in that order such that the bottom side of the top plate layer 540 faces the top side of the middle spring layer 520, and the bottom side of the middle spring layer 520 faces the front side of the substrate wafer 501. The cMUT elements 500, 500A and 500B are separated by separation trenches 515 formed through the top plate 540 and the middle spring layer 520.

In this description, a cMUT element or a micro-electromechanical element refers to a device unit that is capable of performing an energy transformation through the control of an external or built-in control circuit and is individually addressable through the external or built-in control circuit. Each addressable cMUT element defines a device element area of the substrate wafer and a corresponding device element area of the top plate layer. Because the three layers (the substrate wafer 501, the middle spring layer 520 and the top plate layer 540) are arranged substantially parallel to each other and stacked directly on top of each other, the device element area of the substrate wafer and the corresponding device element area of the top plate layer overlie each other vertically and coincide with each other longitudinally (over the surface dimension of the layers).

In one aspect of the present invention, a resilient structure (such as the middle spring layer 520 in the example shown in FIG. 5A) having multiple connectors distributed over the device element area is provided to vertically transport the top player. The multiple connectors facilitate distributed support not limited to edges (peripheral areas) only. In the exemplary structure shown in FIG. 5A, for example, the top plate 540 is connected to the middle spring layer 520 through multiple plate-spring connectors 530, 530*a* and 530*b*. Although connectors 530*b* are located near the device element peripheral defined by separation trenches 515, other connectors 530 and 530*a* are substantially away from the device element peripheral toward the center of the device element area to provide a more flexible, more efficient, and more distributed support to the top plate layer 540. This distributed support may help build a cMUT element of a larger size.

Figure 5B:
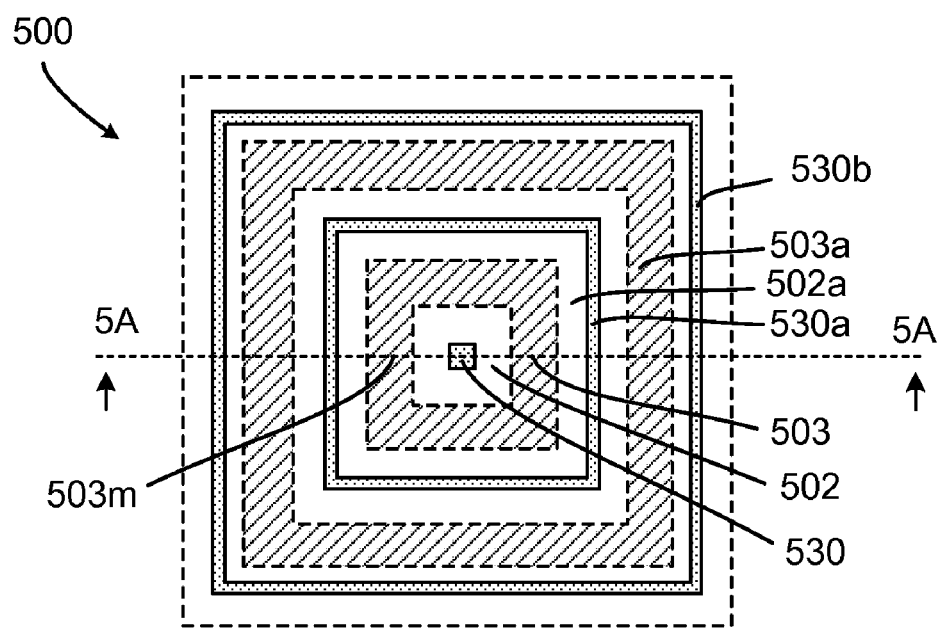
FIG. 5B shows a schematic top view of the cMUT element shown in FIG. 5A without showing the top plate.
Figure 5C:
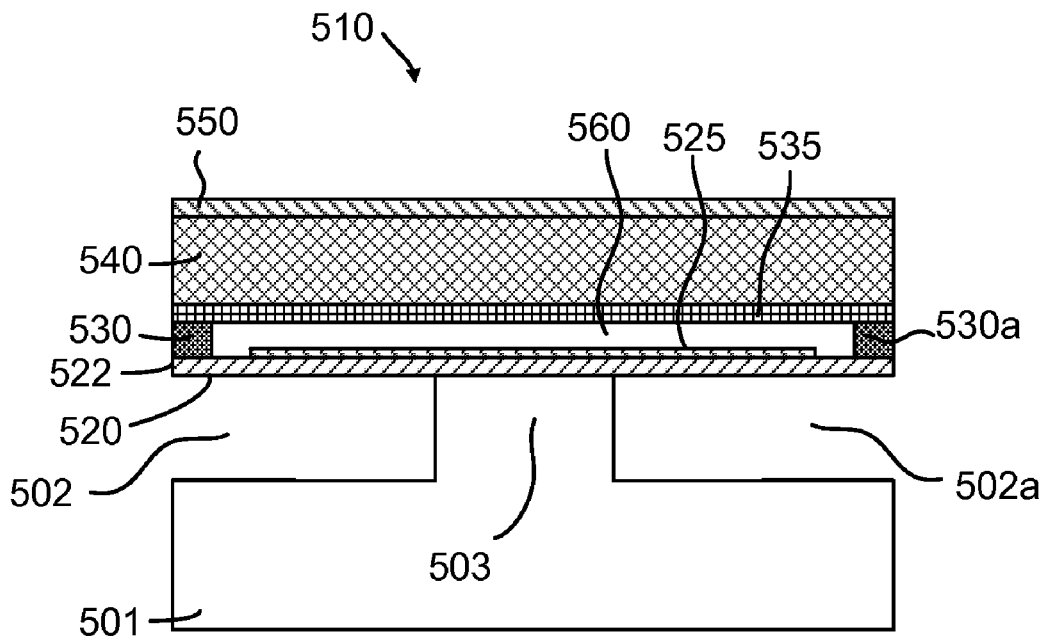
FIG. 5C shows an enlarged view of a selected cMUT portion of the cMUT structure of FIG. 5A.
Figure 5D:
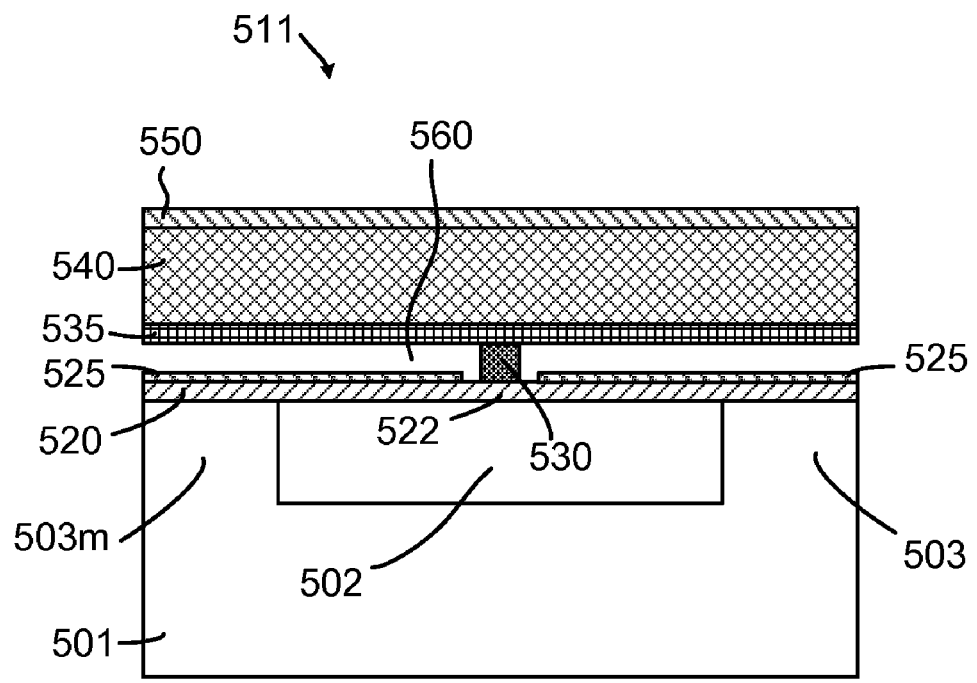
FIG. 5D shows an enlarged view of a different selected cMUT portion, which is another part of the complete cMUT element in FIG. 5A.

For a cMUT that has a very high operating frequency CMUT, however, a basic unit shown in FIGS. 5C-5D may be used as a full CMUT device or element.

FIG. 5B is a schematic top view of the cMUT element 500 without showing the top plate 540. In cross-sectional view of the cMUT element 500 taken along broken line indicated in FIG. 5B is shown in FIG. 5A. In this exemplary configuration, the cMUT element 500 is patterned with concentric squares. In the center is a simple discrete connector 530 positioned on top of the cavity 502 of a simple shape (as shown in the cross-sectional view in FIG. 5A the connector 530 is placed on the middle layer 520 which covers the cavity 502), which is surrounded by a circular sidewall anchor 503, which in turn is surrounded by a circular cavity 502a. Another larger circular connector 530a is positioned on top of the circular cavity 502a, which is surrounded by a circular sidewall anchor 503a of the next level. As will be shown in FIGS. 6-10, however, a variety of different configurations are possible with the present invention.

FIG. 5C is an enlarged view of a selected cMUT portion 510, which is a part of the complete cMUT element 500. The selected cMUT portion 510 is a basic unit, of the complete cMUT element 500 (and other cMUT elements 500A and 500B). The structure of the selected cMUT portion 510 provides a basis to understand the complete cMUT element 500.

As shown in FIG. 5C, the selected cMUT portion 510 includes two halves centered on an imaginary vertical line (not shown) going through the structure from the top to the bottom. As mentioned, for certain application such as a CMUT with a high operation frequency, a full CMUT element or device may use only one cMUT portion 510. For other applications, it may be preferred to use a combination of multiple basic unit is shown in FIG. 5C and FIG. 5D.

The basic structure unit of the cMUT element is built on a substrate wafer 501 on top of which there is a standing feature (referred to as "sidewall anchor" hereinafter) 503 having two sidewalls on two opposing sides bordering cavities 502 and 502a, respectively. The standing feature (sidewall anchor) 503 may be an integrated part of the substrate 501 formed as a result of forming the cavities 502 and 502a, but may also be an additional structure added onto a separate substrate. In one embodiment, for example, the sidewall anchor 503 is part of the middle spring layer 520. The substrate of 501 may either be made of a nonconductive material or a conductive material such as silicon or polysilicon. In a configuration where the sidewall anchor 503 is a separate structure, conductivity of the sidewall anchor 503 may be the same as or different from that of the substrate 501. For example, the substrate 501 may be made of a nonconductive material while the sidewall anchor 503 a conductive material such as silicon or polysilicon.

The cMUT structure shown also has the second cavity 502a long the other side of sidewall anchor 503. Depending on how and where the cMUT portion 510 is taken from the cMUT element 500, the second cavity 502a may either belong to a different and separate cavity, or just another portion of a same circular or extended cavity as the cavity 502. The selected cMUT portion 510 also has a second connector 530a in the other half. Again, depending on how and where the cMUT portion 510 is taken from the cMUT element 500, the second connector 530a may either be a part of a different and separate connector, or just another portion of a same circular or extended connector as the connector 530.

The cMUT structure portion 510 further has these components: a middle spring layer 520 which is preferably an elastic membrane, a bottom electrode 525 placed on the middle spring layer 520, a connector 530 which stands on top of the middle spring layer 520, an insulation layer 535 sitting over the connector 530, a top plate 540 connected to the connector 530 through an intervening insulation layer 535, and a top electrode 550.

The connector 530 stands out from the middle spring layer 520 to define a transducing space 560 below the top plate 540. The transducing space 560 is generally defined between the top plate layer 540 and the top surface of the middle spring layer 520 or the top surface of the sidewall anchor 503, whichever is higher. Where there is an intervening layer between the top plate layer 540 and the top surface of the middle spring layer 520 or the top surface of the sidewall anchor 503, the available transducing space may be reduced. For example, if another layer is deposited over the sidewall anchor 503, and yet another layer is deposited on the bottom of the top plate 540, the transducing space would be defined between these two intervening layers. In the exemplary configuration shown in FIG. 5C, the actual height of the available transducing space 560 may be reduced by the thicknesses of the insulation layer 535, the bottom electrode 525 and the middle spring layer 520. It should be noted that in some embodiments it is possible to have the entire height between the top plate layer 540 and the top surface of the sidewall anchor 503 available for the transducing space 560. For example, a conductive substrate wafer may itself be used to effectuate a bottom electrode on the substrate (e.g., on the sidewall anchor 503) without requiring a separate electrode layer; and cantilevers may be made with segments of middle spring layers connected to the sidewall anchor 503 at sides flush with or lower than the top surface of the sidewall anchor 503, instead of using a continuous middle spring layer placed on top of the sidewall anchor 503.

In some embodiments, both substrate 501 including the sidewall anchor 503 and the middle spring layer 520 are conductive. In this case, the substrate 501 may serve as a conductor to access the conductive middle spring layer 520, while the middle spring layer 520 may serve as the bottom electrode.

The connector 530 is horizontally distanced from the sidewall anchor 503 by a sufficient length to define a cantilever anchored at the sidewall anchor 503 with an exerting end 522 on the connector 530. The cantilever and the cavity 502 enable a vertical displacement of the connector 530, which transports the top plate 540 substantially vertically with a piston-like motion, thus changing the transducing space 560. When the both halves of the cMUT structure 510 move in the same phase, the vertical piston-like motion is further assured.

In this particular example shown, top surface of the sidewall anchor 503 is covered by the middle spring layer 520, which in turn is covered by the bottom electrode 525. Furthermore, the top plate 540 and the connector 530 do not connect with each other directly but are intervened by the insulation layer 535 therebetween. The transducing space 560 between the top plate 540 and the top surface of the sidewall anchor 503 is therefore partially occupied by the middle spring layer 520, the bottom electrode 525 and the insulation layer 535. It is noted that the part of the middle spring layer 520 covering the top surface of the sidewall anchor 503, the bottom electrode 525 and the insulation layer 535 are optional. In any event, in order to achieve the intended energy transformation, the transducing space 560 should not be entirely occupied by these extra layers if they are included in the structure.

FIG. 5D is an enlarged view of a different selected cMUT portion 511, which is another part of the complete cMUT element 500. Compared to the selected cMUT portion 510 shown in FIG. 5C, the selected cMUT portion 511 is taken from a shifted location. The selected cMUT portion 511 is built on a substrate 501, which has a cavity 502 bordered by two sidewall anchors 503 and 503a on two opposite sides. The cMUT structure portion 511 further has these components: middle spring layer 520, bottom electrode 525 placed on middle spring layer 520, connector 530 which stands on top of the middle spring layer 520, insulation layer 535 sitting over the connector 530, top plate 540 connected to the connector 530 through an intervening insulation layer 535, and top electrode 550.

The connector 530 (which is also shown in FIG. 5C) stands on the middle spring layer, and is horizontally distanced from the sidewalls of both the sidewall anchor 503 and the sidewall anchor 503a. The middle spring layer 520 between the sidewall anchor 503 and the sidewall anchor 503a defines a double-cantilever anchored at the sidewall anchor 503 and the sidewall anchor 503a. The double-cantilever is connected head-to-head at location 522 where the connector 530 is located to form a bridge.

The top plate 540 is placed over the connector 530, which separates the top plate 540 from the middle spring layer 520 to define a transducing space below the top plate. The double-cantilever and the cavity 502 enable a vertical displacement of the connector 530, which transports the top plate 540 substantially vertically, thus changing the transducing space and activating a transducing member in the transducer for energy transformation.

The above novel cMUT design has essentially done away with the conventional concept of the cell insulation wall which divides a cMUT element into cells and is required to support and clamp the membrane at the perimeter of each cMUT cell. The conventional cMUT designs shown in FIG. 1, including the cMUT design as disclosed in the U.S. Pat. No. 7,030,536, all require a cell insulation wall (e.g., cell insulation wall 18 in FIGS. 1A-1C, or the compliant cell insulation wall 48 in FIGS. 4A-4B) at the perimeter of each cMUT cell to support and clamp the perimeter of the membrane. The cell insulation wall defines the prior art cMUT cells. Within the perimeter defined by the insulation wall, the bottom electrode in the prior art cMUT structure is either directly deposited on the substrate 11 (FIG. 1) or deposited on the top of a pedestal 43 (FIG. 4A), which is separated from the cell insulation wall. Because the majority of the membrane (16 in FIG. 1 or 46 in FIG. 4A) is unsupported, the size of each cell and the selection of the materials for the membrane is limited.

In contrast, with the cMUT design as shown in FIG. 5A and FIG. 5B, the cMUT element is no longer required to be divided into cells and thus has no need of an insulation wall to define cell perimeters. The top plate layer 540 and the top electrode 550 are supported by a resilient structure (multiple cantilevers in the embodiment shown) through multiple connectors that can be freely positioned and distributed based on need, thus effectively distributing the entire load of the top plate layer 540 over multiple springs (cantilevers). This solves the problem of the cell limitation inherent to the prior art designs. The middle spring layer 520 and a bottom electrode 525 are supported by multiple sidewall anchors 503 which can also be distributed across the entire substrate wafer 501 based on need, rather than being limited to peripheral areas. There is no central pedestal and a separate peripheral compliant support structure. Only multiple sidewall anchors 503 distributed across the entire device element area are required to support the middle spring layer 520 and the bottom electrode 525. Each anchor 503 serves both as a support to the bottom electrode and as an anchor to a corresponding cantilever (or two cantilevers in the configuration shown in FIG. 5A and FIG. 5B, one on each side of the sidewall anchor 503).

With this design, a cMUT element with a very large active area may be formed. The operating frequency or frequency response of the cMUT element may be adjusted not only by selection of the materials for the top plate 540 but also by the configuration of the multiple cantilevers, including the spring strength of individual cantilevers and the cantilever distribution density profile across the area of the cMUT element.

In principle, a cMUT element of the present invention may have an active area significantly larger than what would be possible with the conventional cMUT structures. The active area of a cMUT may be defined as the total movable area. For cMUT elements of a comparable overall size (cMUT element area), the active area of the cMUT element of the present invention may still be much greater than the total active area of the multiple cMUT cells in a conventional cMUT element. For example, the active area of the inventive cMUT is close to 100% of the element (device) area, while the total active area of multiple cMUT cells in a conventional cMUT element may cover about 60-90% of the element (device) area. Usually, the higher the operation frequency is, the lower the active area percentage is for a conventional cMUT. In addition, even for a given movable area, the cMUT of the present invention potential yields a greater effective active area, which may be defined as the area of the effective electric field activating the capacitors.

The entire top plate 540 formed above the substrate wafer 501 may be movable without any clamped or fastened area. If desired, multiple cMUT elements can be formed by forming separation trenches 515 through the top plate 540 and the middle spring layer 520. In principle, however, the entire cMUT structure with a very large active area may be used as a single cMUT element.

Furthermore, with the cMUT structure design in FIG. 5A and FIG. 5B, the top plate 540 may be separated into a plurality of smaller top plates of identical or different sizes and shapes. Each smaller top plate may be addressed as a single cMUT element; alternatively multiple smaller top plates may be combined together and addressed as a single cMUT element.

Furthermore, unlike the flexible membrane clamped on its edges (or posts) in the conventional cMUTs, the top plate 540 shown in FIG. 5A and FIG. 5B can be designed to be either flexible or rigid. With a rigid top plate, the whole surface of the cMUT, which may include any number of separate smaller top plates 540, may be movable with a very uniform displacement profile.

The location of the top electrode 550 may be at any position above the transducing space 560. The bottom electrode 525 can reside on the substrate wafer 501 and/or on a part of the middle spring layer 520. The top plate 540 is actuated by the applied electrode field between two electrodes 550 and 525 to transmit the ultrasound into the medium, and the ultrasound can be detected if it impinges on the top plate 540 cause the capacitance between two electrodes 550 and 525 to change.

In the exemplary cMUT structure 500 shown in FIGS. 5A-5B, the middle spring layer 520 is a continuous layer placed over the top of the multiple sidewall anchors 503 and a multiple cavities 502. The middle spring layer 520 thus occupies the entire device element area longitudinally (i.e., in the lateral or surface dimension). This configuration allows the entire top plate 540 to be supported by cantilevers through connectors 530 that can be placed or distributed all over the entire device element area without being limited to places near the edge of the element. It is appreciated, however, that the middle spring layer 520 may comprise multiple small segments that are either connected to each other at certain points or completely separated from each other. Particularly, segments of middle spring layer 520 may be used in a way where each segment is connected or anchored to a respective sidewall anchor 503 and covers at least part of a respective cavity 502 to allow cantilevers to be formed, but leaves part of the top surface of the sidewall anchors 503 uncovered. Such a configuration may allow the flexibility of using different materials and different thicknesses for the middle spring layer 520, but may complicate the fabrication process.

Regardless of the configurations of the middle spring layer, it is envisioned that in some preferred embodiments, the cantilever-forming anchor surface(s) (the top surface of the sidewall anchors 503) and the associated cantilever areas of cMUT element 500 together cover at least half of the device element area in order to achieve an effectively distributed cantilever-support of the top plate 540 and greater effective active areas. The cantilever areas may be defined as the total area of the cavities, or alternatively as the total area of the middle spring layer 520 covering the cavities. Preferably the cantilever-forming anchor areas and the cantilever areas are at least 80% of the device element area, and further preferably near 100% of the device element area, as is the case showing in FIG. 5A. Pedestals that do not serve to anchor a cantilever is not required, and preferably not formed at all within the device element area of the substrate wafer 501 in order to maximize the cantilever-forming anchor areas as described above. In some embodiment, the cantilever areas and the associated connector areas are minimized while the cantilever-forming anchor areas are maximized for higher effective electrical field area for energy transformation. For a given number of the cantilevers, the cantilever area may be minimized by using a thinner middle spring layer with shorter cantilever dimensions while still achieving desired spring strength. These configurations provide a potential advantage over the prior art designs that have peripheral support for clamped membranes.

Within the general principle of the present invention, there is a great room of design freedom in terms of the overall size of each addressable device element, the size, shape and arrangement of the cavities, the size, shape and arrangement of the anchors for cantilevers, the size, shape and arrangement of the connectors, and the thickness, shape, segment (separation) pattern and material selection of each layers (the substrate wafer, the middle spring layer and the top plate layer).

A cMUT element in accordance with the present invention is no longer necessarily made of multiple cells each having a flexible membrane. Instead, the cMUT element may have a single (rigid or flexible) top plate. Even if multiple top plates are used, these top plates do not need to be clamped at some cell boundaries like the membranes for each cell in the prior art. The multiple top plates further do not need to be identical to each other. Generally, even with multiple top plates, only a small number of the top plates would be necessary for each addressable device element, much fewer than the number of individually clamped cells that would have been required in conventional cMUT designs.

The cantilevers formed from the spring middle layer function as embedded springs that can be of a variety of spring strength, size and density variations. These embedded springs may be made of a single contiguous flexible membrane or multiple flexible membranes of identical or different size and shape. The locations of the plate-spring connectors (e.g., connectors 530) may be designed to obtain the optimal displacement for the top plate or the desired frequency response for the cMUT during the cMUT operation. The configuration of the top plate 540, such as using smaller top plate segments, may also be adjusted to achieve desired frequency response for a CMUT element with a relative large size.

In summary, unlike the cMUTs in the prior art, there may be no clamped (or fixed) area on the transducer surface of this invention, and the top surface of the cMUT may be made of a single top plate or multiple top plates which are supported by springs (cantilevers) deployed at strategic locations. As a result the cMUT in accordance with the present invention has the potential to solve many problems of the prior cMUTs mentioned in the background section. The potential advantages may include:

(1) Since the entire top surface of the transducer is movable with a much more uniform displacement, both the average displacement and the average electrical field between two electrodes of the cMUT element may be improved. This may lead to better transmission and reception performances.

(2) With the design of the present invention, it is possible to make a transducer with no or very little inactive surface area so that the device fill factor can be near perfect. This is especially important for a high frequency cMUT because the transducer dimension is small.

(3) The parasitic capacitance of the transducer can be dramatically decreased by selecting proper properties of the middle spring layer. For example, non-conductive materials may be used for the middle spring layer. This improves the transducer sensitivity.

(4) The transducer breakdown voltage can be improved by using a proper material for the middle spring layer so that a high electrical field may be obtained between two electrodes to improve the device performance.

(5) The uniformity of the cMUT surface displacement can be further improved by increasing the stiffness of the top plate. With a properly chosen thickness of the top plate, the cMUT surface displacement may have minimum impact or no impact on ultrasonic beam pattern emitted from the transducer surface.

(6) Because the cMUT cell boundary pattern within the cMUT element surfaces can be eliminated with the new design, there is no high frequency limitation caused by such cell boundary patterns. This may improve the bandwidth of the cMUT.

(7) Without having to use a great number of individual cells in each cMUT element, the phase difference of the motion at the different locations (different cells) on the cMUT surface is minimized. This is true especially if a rigid top plate is used. This can improve the device performance, especially when the cMUT works in a high quality factor (Q-factor) condition, e.g., in air or low pressure environment.

(8) The anchors (sidewall anchors 503 for anchoring the middle spring layer 520) of the cMUT may be made slightly smaller than the top plate so that there is more room at the cMUT element edge for adding decoupling structures between the cMUT elements to reduce the cross coupling.

(9) The present invention provides more design flexibility for the MUTs than those of the prior arts. For example, the top plate 540 may be designed to be of different shapes and configurations; the embedded springs (e.g. cantilevers made from the middle spring layer as shown in FIGS. 5A and 5B) may have different shapes and different spring constants by selecting the proper membrane dimensions. Moreover, the embedded springs can attach to the different locations on the top plate 540.

Figure 6:
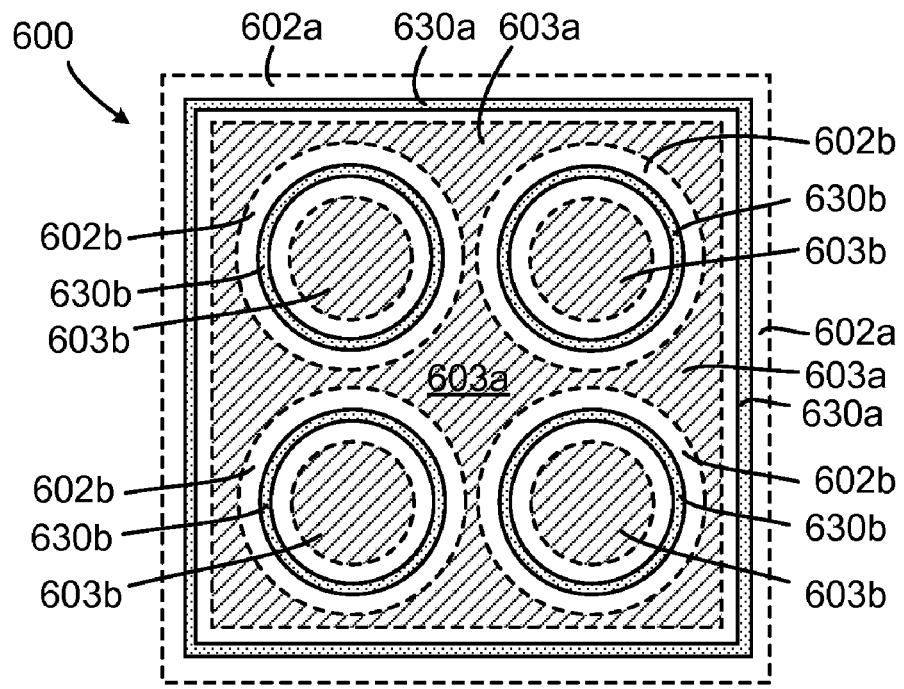
FIG. 6 shows a schematic of the surface pattern of the cavities, anchors and connectors under the top plate layer in a first example of an addressable cMUT element in accordance with the present invention.

FIGS. 6-11 show five exemplary designs of the spring (cantilever) distribution in accordance with the present invention. FIG. 6 shows a schematic of the surface pattern of the cavities, anchors and connectors under the top plate layer in a first example of an addressable cMUT element in accordance with the present invention. The addressable cMUT element 600 has an overall square shape, and includes:

(1) a peripheral cavity 602a with an annular shape defining the outer rim of the cMUT element 600;

(2) a circular connector 630a placed over the peripheral cavity 602a;

(3) an outer anchor 603a surrounded by the peripheral cavity 602a, the outer anchor 603a being contiguous throughout the general device element area of the substrate wafer except for the inner cut-out areas as shown;

(4) four identical inner cavities 602b each having an annular shape, each cavity 602b dividing the substrate wafer into an inner island (respective anchor 603b) and an outer region (the common outer anchor 603a in this particular example);

(5) four identical inner circular connectors 630b each placed over a respective inner cavity 602b; and (6) four identical inner anchors 603b surrounded by a respective inner cavity 602b.

In this example, the outfit anchor 603a is connected to the circular connector 630a through a middle spring layer (not shown). The middle spring layer may be a single continuous layer covering the entire device element area, or separate areas connected to the anchors at selected positions. Although the middle spring layer is thin in its vertical dimension, it may be of any desired span or size on its surface (longitudinal or lateral dimension) up to covering the entire device element area. Preferably, the middle spring layer is contiguous over large areas to make plane cantilevers instead of separate narrow strip cantilevers. In the example shown in FIG. 6, because the circular connector 630a is a contiguous closed circle, a single plane cantilever may be formed over the peripheral cavity 602a, anchored on the circular rim of the outer anchor 603a. However, it is appreciated that the connector 630a (and other connectors herein) may be of any pattern, including separate segments. Similar formation possibilities apply to the four connectors 630b and the cantilevers formed over the four cavities 602b. It is appreciated that the shapes and relative sizes of the cavities 602b, connectors 630b and the anchors 603b can be varied rather freely without departing from the general concept of the present invention. In particular, the term "circular" used in this description refers to a formation that has a substantially close-ended configuration, and does not suggest in any way the item or formation preferred to is round-shaped or in any other particular shape.

Furthermore, the cantilevers formed over cavities 602b may be anchored either on the outer anchor 603a or on the inner anchor 603b, or both (to form a bridge-like double cantilever connected head to head).

Figure 7:
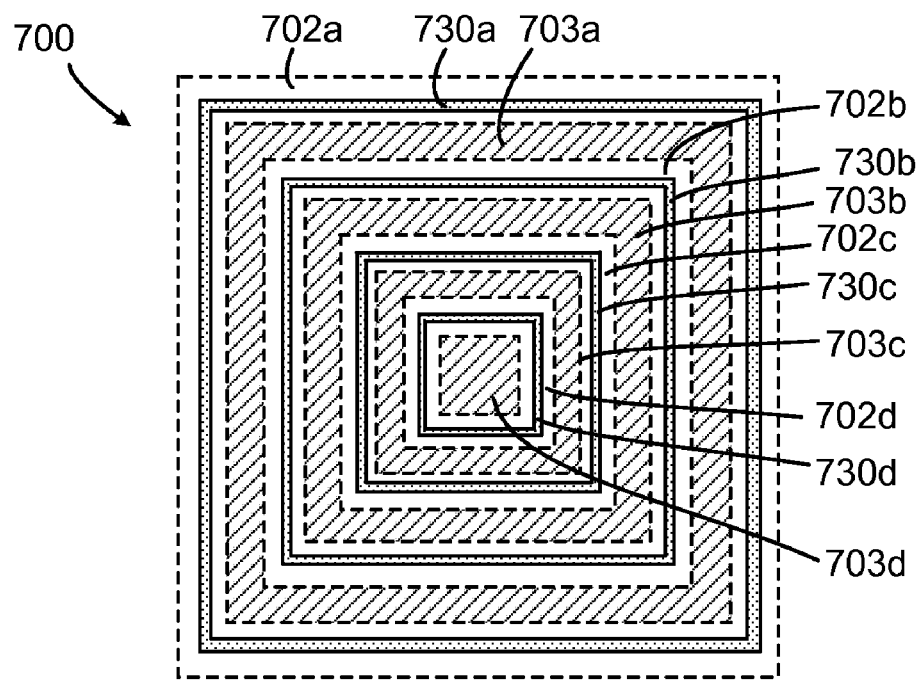
FIG. 7 shows a schematic of the surface pattern of the cavities, anchors and connectors under the top plate layer in a second example of an addressable cMUT element in accordance with the present invention.

FIG. 7 shows a schematic of the surface pattern of the cavities, anchors and connectors under the top plate layer in a second example of an addressable cMUT element in accordance with the present invention. The addressable cMUT element 700 has an overall square shape, and includes:

(1) a plurality of circular cavities 702a, 702b, 702c, and 702d of decreasing sizes each containing the trenches of smaller sizes (if there is any);

(2) a plurality of circular connectors 730a, 730b, 730c and 730d placed over the cavities 702a, 702b, 702c, and 702d, respectively; and (3) a plurality of anchors 703a, 703b, 703c and 703d surrounded by the cavities 702a, 702b, 702c, and 702d, respectively.

With these cavities, connectors and anchors, various formations of cantilevers are possible, in similar ways discussed above.

Figure 8:
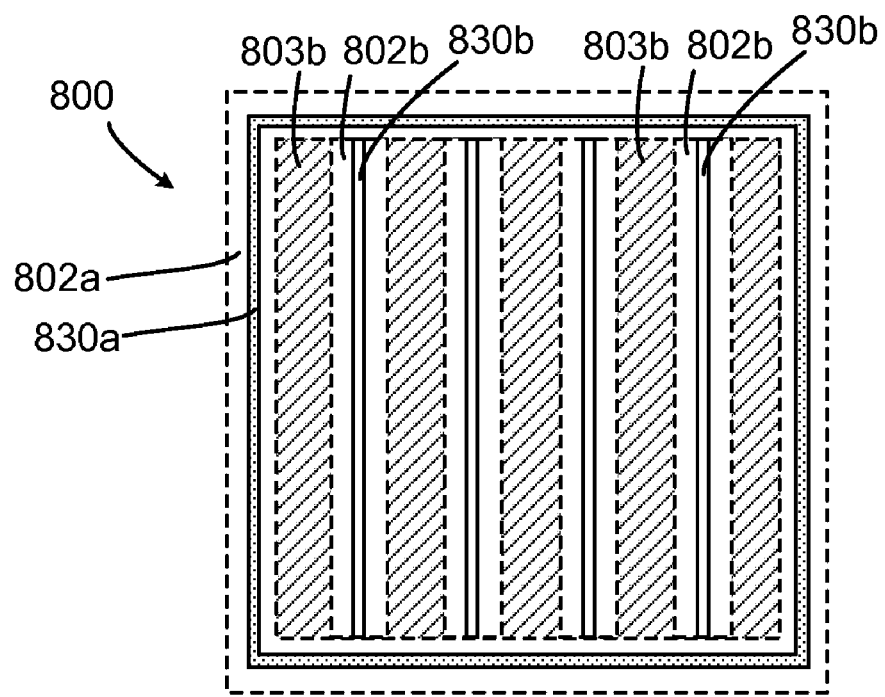
FIG. 8 shows a schematic of the surface pattern of the cavities, anchors and connectors under the top plate layer in a third example of an addressable cMUT element in accordance with the present invention.

FIG. 8 shows a schematic of the surface pattern of the cavities, anchors and connectors under the top plate layer in a third example of an addressable cMUT element in accordance with the present invention. The addressable cMUT element 800 has an overall square shape, and includes:

(1) an outer circular cavity 802a surrounding an outer circular connector 830a;

(2) a plurality of extended straight cavities 802b substantially parallel to each other;

(3) a plurality of extended straight connectors 830b substantially parallel to each other and placed over the respective cavity 802b; and (4) a plurality of extended straight anchors 803b parallel to each other and alternating with cavities 802b therebetween.

Figure 9:
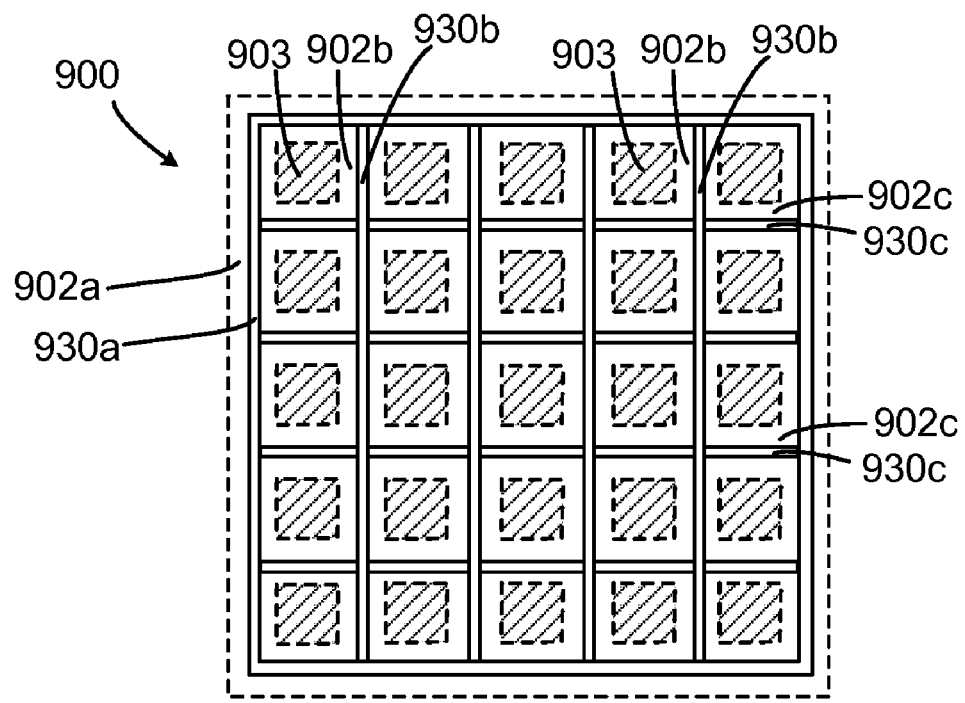
FIG. 9 shows a schematic of the surface pattern of the cavities, anchors and connectors under the top plate layer in a fourth example of an addressable cMUT element in accordance with the present invention.

FIG. 9 shows a schematic of the surface pattern of the cavities, anchors and connectors under the top plate layer in a fourth example of an addressable cMUT element in accordance with the present invention. The addressable cMUT element 900 has an overall square shape, and includes:

(1) an outer circular cavity 902a surrounding an outer circular connector 930a;

(2) a first plurality of extended straight cavities 902b substantially parallel to each other;

(3) a first plurality of extended straight connectors 930b substantially parallel to each other and placed over the respective cavity 902b;

(4) a second plurality of extended straight cavities 902c substantially parallel to each other; and (3) a second plurality of extended straight connectors 930c substantially parallel to each other and placed over the respective cavity 902c;

The second plurality of extended straight cavities 902c intersects with the first plurality of extended straight cavities 902b to form a grid of cavities defining an array of discrete islands (anchors) 903. The resultant cavity formation is a multiple small square-shaped circular cavities.

Figure 10:
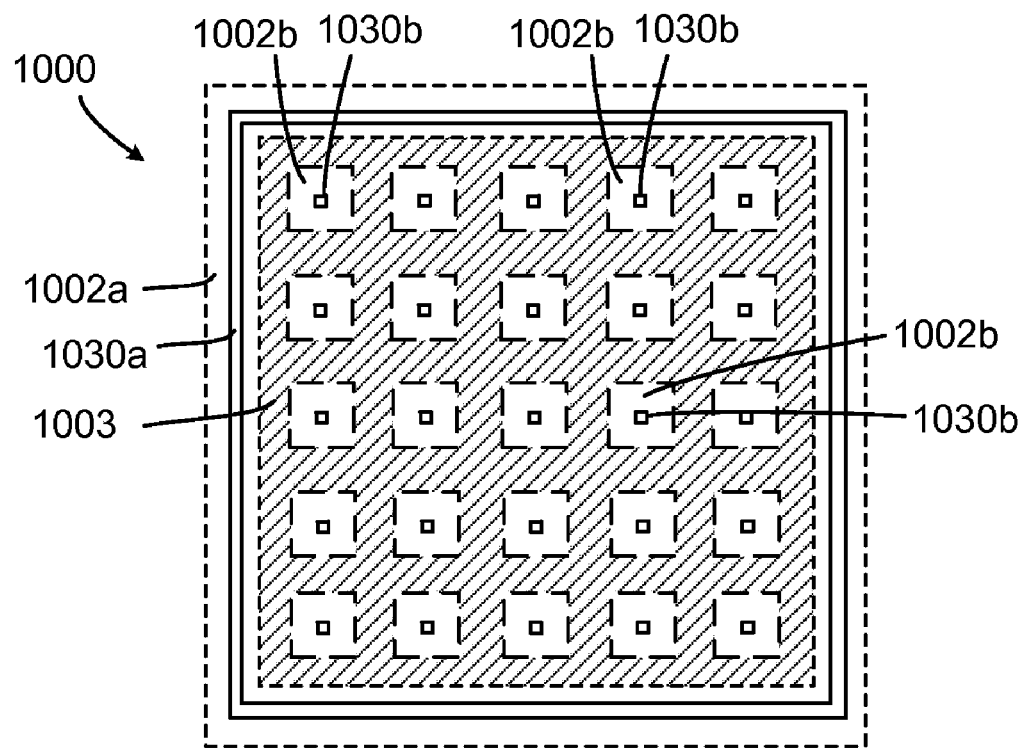
FIG. 10 shows a schematic of the surface pattern of the cavities, anchors and connectors under the top plate layer in a fifth example of an addressable cMUT element in accordance with the present invention.

FIG. 10 shows a schematic of the surface pattern of the cavities, anchors and connectors under the top plate layer in a fifth example of an addressable cMUT element in accordance with the present invention. The addressable cMUT element 1000 has an overall square shape, and includes:

(1) an outer circular cavity 1002a surrounding an outer circular connector 1030a and a contiguous anchor 1003;

(2) a plurality of simple cavities 1002b separated from each other and arranged side-by-side; and (3) a plurality of discrete connectors 1030b placed over a respective simple cavity 1002.

In this configuration, plurality of simple and discrete cavities 1002b and plurality of discrete connectors 1030b share a common contiguous anchor 1003.

It should be noted that although the exemplary formations in FIGS. 6-10 all have an outer circular cavity defining the boundary or perimeter of the addressable cMUT element, such an outer circular cavity is not required. This may be illustrated using the next example with reference to FIG. 11.

Figure 11:
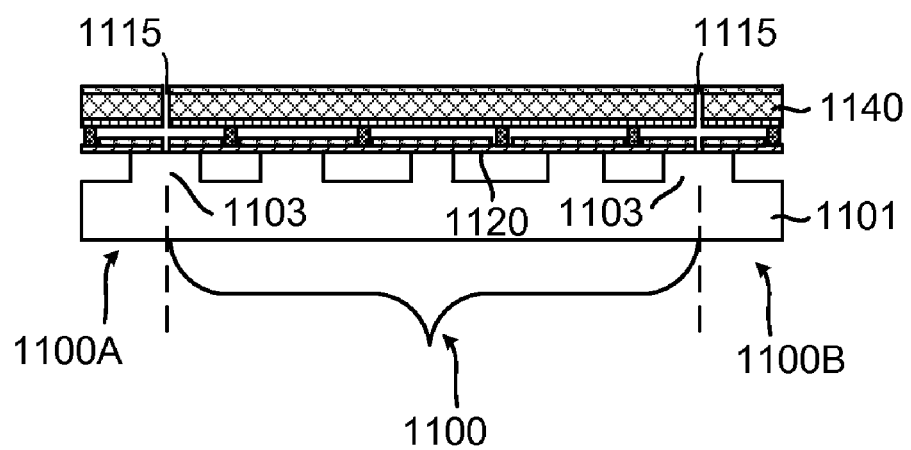
FIG. 11 shows a cross-section view of another cMUT structure of the present invention showing a complete cMUT element and parts of neighboring cMUT elements.

FIG. 11 is a cross-section view of a cMUT structure showing a complete cMUT element 1100 and parts of neighboring cMUT elements 1100A and 1100B, one on each side. The cMUT element 1100 is very similar to the cMUT element 500 in FIGS. 5A and 5B, except that the separations that form the cMUT elements (1100, 1100A and 1100B) are at different locations on the substrate than that in FIGS. 5A and 5B. Like the cMUT structure in FIGS. 5A and 5B, the cMUT structure in FIG. 11 is built on a substrate wafer 1101 and also has a middle spring layer 1120 and a top plate 1140. The cMUT elements 1100, 1102 and 1104 are separated by separation trenches 1115 formed through the top plate 1140 and the middle spring layer 1120. Because the separation trenches 1115 are cut through transducing spaces 1160 instead of connectors 1130 (as is the case in FIGS. 5A and 5B), the boundary of the cMUT element 1100 at the substrate wafer level is half of the anchors 1103 instead of the cavities as in the cMUT element structure 500.

Furthermore, the exemplary formations in FIGS. 6-10 all have an inclusive circular connector surrounding the bulk of the cMUT element. Such a circular connector at an outer peripheral of the cMUT element may be used to seal the cMUT element during fabrication. Sealing may be necessary for applications in a liquid medium but may not be necessary for applications in air or vacuum. In any event, an inclusive circular connector at an outer peripheral is not required.

As shown in the above examples, wide varieties of formations are available within the spirit of the present invention. Islands may be formed on the substrate wafer by forming cavities. Although in principle not all islands must serve as an anchor to form a cantilever, it is preferred that as many as islands are effectively utilized as anchors to optimize the performance and design freedom.

As shown in the above examples, multiple cantilevers may be formed in the cantilever-forming area. The middle spring layer may have a plurality of connectors connecting to the top plate layer. The plurality of connectors may be distributed across the device element area to define a connector density profile indicating an average connector density per area at each location on the middle spring layer. Each connector and its corresponding cantilever may be considered as a spring having a spring strength, which when combined with the respective average connector density at the location can define an effective spring intensity profile. For example, the effective spring intensity may be defined as spring strength per unit area at a location, which would be determined by combining the spring strength of individual cantilevers and the number of cantilevers in a unit area (spring density).

As shown in the examples described herein, the anchors (e.g., sidewall anchors 503) and their corresponding connectors may be distributed across the substrate wafer in any pattern to achieve desired support characteristics such as device frequency responses and mode shapes.

FIGS. 12A-12J show examples of spring (cantilever) distribution profiles. These examples also combine spring distribution profiles with special shapes and patterns of the top plate layer.

Figure 12A:
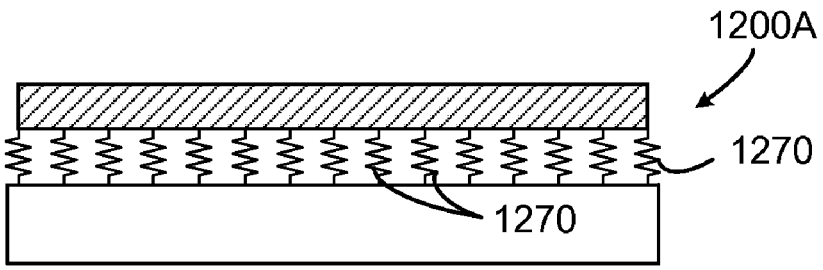
FIGS. 12A-12J show examples of spring (cantilever) distribution profiles.

FIG. 12A shows a cMUT element 1200A having a plurality of identical cantilevers each represented by a spring symbol 1270 evenly distributed over the device element area. The resultant effective spring intensity is substantially uniform over the device element area.

Figure 12B:
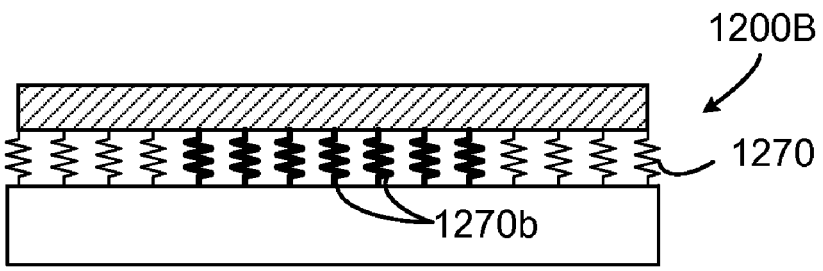

FIG. 12B shows another cMUT element 1200B having two types of cantilevers represented by springs 1270a and springs 1270b. Springs 1270b use thicker spring symbols to represent stronger spring strength. In this example, the effective spring intensity is significantly higher at area locations near a center of the device element area than locations near a perimeter of the device element area.

Figure 12C:
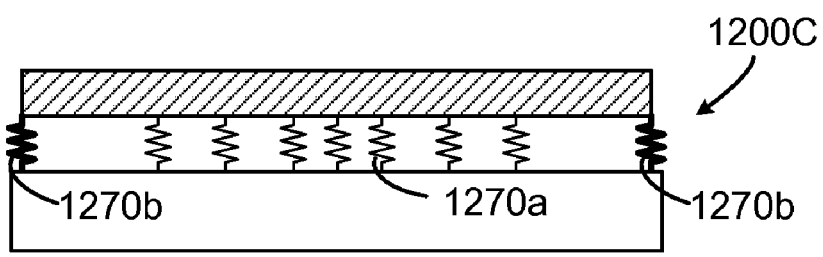

FIG. 12C shows another cMUT element 1200C having two types of cantilevers represented by springs 1270a and stronger springs 1270b. In this example, the effective spring intensity is lower at area locations near a center of the device element area than locations near a perimeter of the device element area. In addition, the springs 1270a bar non-uniformly distributed in the device element area.

Figure 12D:
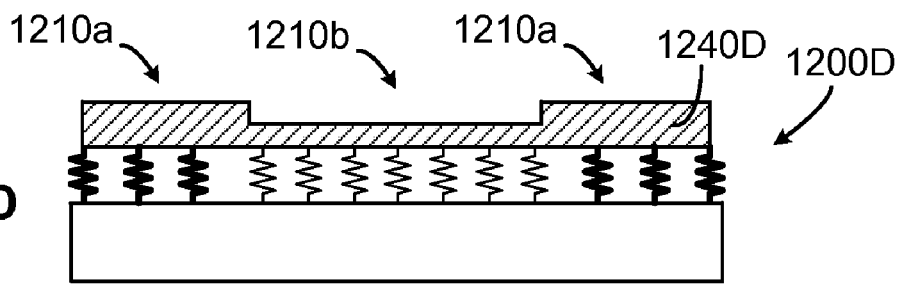

FIG. 12D shows another cMUT element 1200D having two types of cantilevers represented by springs 1270a and stronger springs 1270b. In this example, the device element area comprises a first region 1210a and a second region 1210b. The thickness of the top plate layer 1240D is greater in the first region 1210a than in the second region 1210b. The thickness in the first region 1210a may correspond to a normal thickness of the top plate layer 1240D and the smaller thickness in the second region 1210b may correspond to a bottom thickness of a cavity formed on the top plate layer 1240D.

Figure 12E:
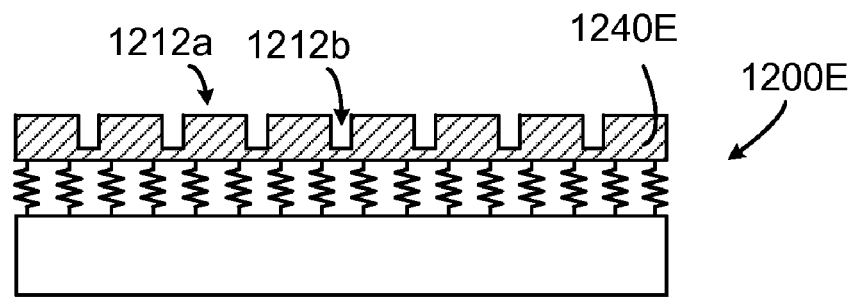

FIG. 12E shows another cMUT element 1200E having a plurality of cantilevers represented by springs 1270. In this example, the top plate layer 1240E has a thickness profile having two different thicknesses 1212a and 1212b alternating across the device element area. The greater thickness may correspond to a normal thickness of the top plate layer 1240E while the smaller thickness may correspond to a bottom thickness of a cavity formed on the top plate layer 1240E. The two thicknesses 1212a and 1212b may regularly alternate across the device element area. This configuration may help to improve the rigid/mass ratio of the top plate.

Figure 12F:
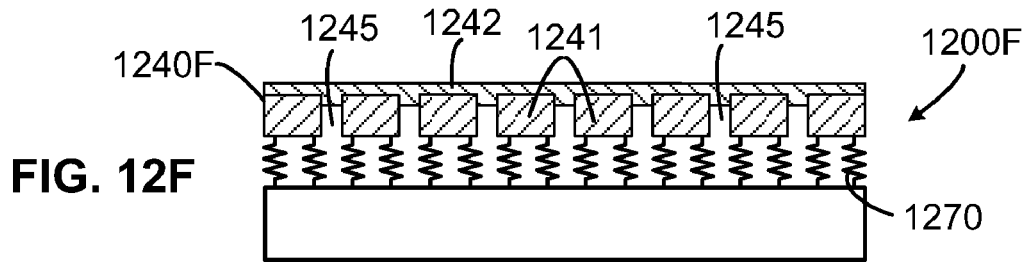

FIG. 12F shows another cMUT element 1200F having a plurality of cantilevers represented by springs 1270. In this example, the top plate layer 1240F is made of two different materials. The first material may make up a plurality of segments 1241 divided by separation trenches 1245. The second material 1242 may be provided as connectors which connect the segments 1241 by spanning over the trenches 1245. The second material 1242 may be a sealing material to fill or partially fill the trenches 1245.

Figure 12G:
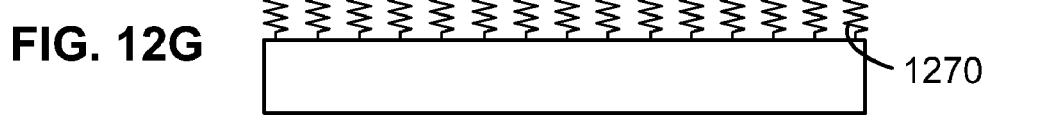

FIG. 12G shows another cMUT element 1200G having a plurality of cantilevers represented by springs 1270 which are uniformly distributed across the cMUT area. In this example, the top plate layer 1240G has a thickness profile in which the top plate layer 1240G is thicker in a central region than in a region close to the perimeter of the cMUT element 1200G.

Figure 12H:
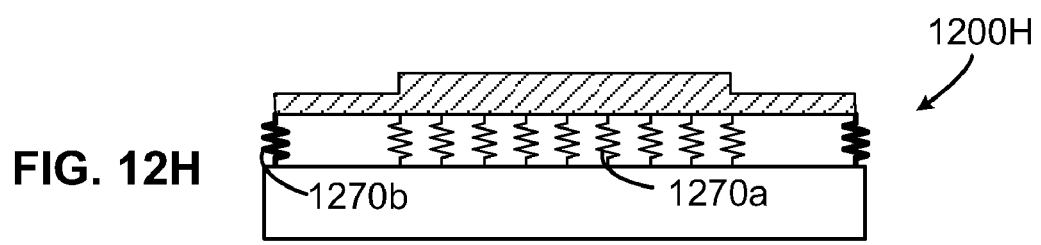

FIG. 12H shows another cMUT element 1200H which is similar to the cMUT element 1200G except that the cMUT element 1200H has two types of cantilevers represented by springs 1270a and stronger springs 1270b. The stronger springs 1270b are deployed at edges (perimeter) of the cMUT element 1200H.

Figure 12I:
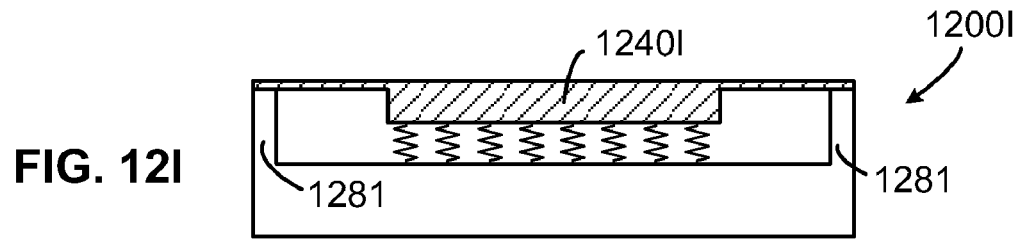

FIG. 12I shows another cMUT element 1200I having a plurality of cantilevers represented by springs 1270 which are uniformly distributed in a middle region of the cMUT area. In this example, the top plate layer 1240I has a thickness profile in which the top plate layer 1240G is significantly thinner in the perimeter of the cMUT element then in the middle region. In one embodiment, the top plate layer 1240I is very thin and flexible near the parameter but rigid in the middle region. The top plate layer 1240I may even be clamped (or fixed) or nearly clamped at perimeter sidewalls 1281 without the support of a cantilever (spring). Even in this special case, however, there are no clamped (or fixed) areas within the surface of cMUT elements except for the edges, and the cMUT element 1200I still has at least a central portion of the top plate 1249I supported by the embedded springs located underneath to move in the piston-like motion. Therefore, the cMUT in such special configurations would still benefit from the potential advantages of the present invention over the conventional cMUTs.

Figure 12J:
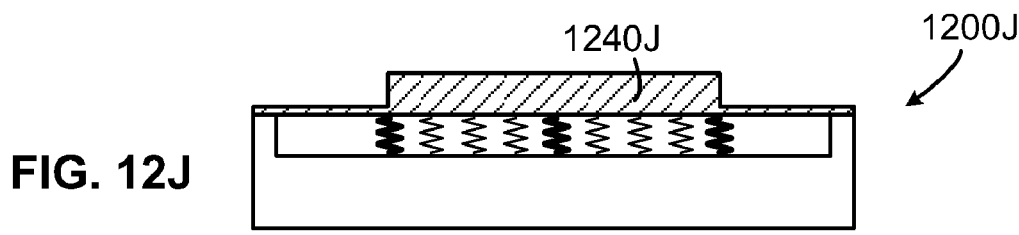

FIG. 12J shows another cMUT element 1200J which is similar to the cMUT element 1200I except that the springs supporting the middle region of the top plate layer 1240J has two types of different springs strengths and distributed with a desired distribution pattern.

Many other possible cMUT designs for the top plate and embedded springs may be made with the present invention.

Taking advantage of the design flexibility in the present invention, the transducer can be made to have a desired frequency response and optimal transmission and reception performances. In addition to the variations of cantilever distribution profiles and the material selection, mass and thickness profiles of the top plate layer as shown above, other features or variations of embodiments may be incorporated into the micro-electro-mechanical transducer in accordance with the present invention.

There are many possible combinations of material properties and size, shape and locations of the components in the micro-electro-mechanical transducer in accordance with the present invention. Electrically, any combination of the material and complement selections desirably should prevent the electrical shorting between two cMUT electrodes. The combination desirably should also enhance the electrical field between the two electrodes for a given input voltage and reduce the parasitic capacitance of the cMUT. It is also important to select materials with better reliability. For example, the mechanical reliability of the middle spring layer is important since this layer bears the maximum mechanical stress of the device. For this consideration, single crystal silicon is a good selection. In addition, the conductivity of the middle spring layer may be designed to be very low to reduce the parasitic capacitance. Therefore, a dielectric material (e.g., silicon nitride) is suitable. If single crystal silicon is selected as the material for the middle spring layer, low-doping level or intrinsic silicon may be used as a starting material for the middle spring layer, which may be subsequently selectively and highly doped in areas designed to be the bottom electrode.

Figure 13:
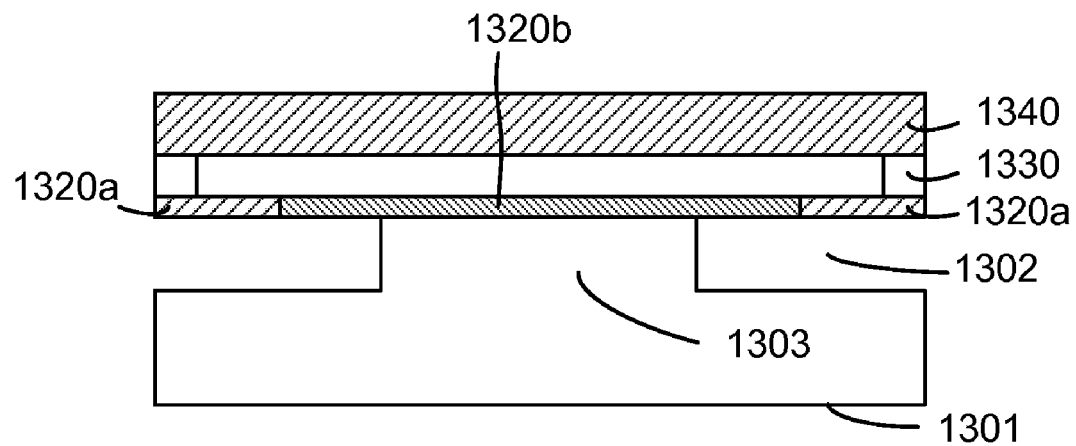
FIG. 13 shows an example of doping profile of a silicon middle spring layer.

FIG. 13 shows an example of doping profile of a silicon middle spring layer. Similar to other MUT structures shown herein, the MUT structure in FIG. 13 has cavity 1302 (which can be vacuum sealed in immersion application), sidewall anchor 1303, plate-spring connectors 1330, and top plate layer 1340. The MUT in FIG. 13, however, has a silicon middle spring layer that has two different types of regions, which are intrinsic or very light doped silicon regions 1320a and highly doped silicon region 1320b. The highly doped silicon region 1320b may be effectuated as a bottom electrode to substitute a separate conductive layer deposited on the middle spring layer as the bottom electrode as shown in other embodiments. Alternatively or additionally, the bottom electrode may be effectuated by using a conductive substrate wafer 1301.

Moreover, regardless of how the bottom electrode is fabricated or effectuated, the doping types can be made different between regions 1320a and 1320b in the middle spring layer of FIG. 13 to form a PN junction between the two regions. This may further increase the breakdown voltage of the transducer and reduce the parasitic capacitance by selecting a proper bias voltage on the PN junction.

In the cMUT structure of the present invention, the top electrode can be located in the any position as long as it moves with the top plate. But the top electrode desirably should be designed to maximize the electric field between two electrodes without electric shorting. For example, if the top plate is conductive (e.g. highly doped silicon), the top electrode (usually a metal layer) may be place on the top of the top plate. If the top plate is not conductive (e.g., using silicon nitride, LTO, or PMMA), the top electrode may be placed at the bottom side of the top plate layer, and preferably on the top of an insulation layer (e.g., insulation layer 535 in FIG. 5B) which is placed over the plate-spring connectors. This helps to obtain a stronger electrical field between two electrodes.

One highly effective method for forming or introducing top plate in a cMUT structure of the present invention is to use wafer-bonding technology in which a prime silicon wafer or an SOI wafer having a desired silicon layer on an insulation layer is bonded to the substrate and the middle spring layer. In that case, the resultant top plate would include a silicon layer or polysilicon layer. Such a layer is relatively conductive for the purpose of the applications envisioned in the present invention. Correspondingly, measures to reduce the chance for shorting between the top electrode and the bottom electrode may be used.

An insulation layer such as the insulation layer 535 in FIG. 5B is used to prevent shorting between two electrodes in case the two electrodes contact each other during the operation. The insulation layer can be located on either the top or the bottom side of the transducing space defined between two electrodes. The insulation layer 535 in FIG. 5B is an example of the former configuration. Usually it is preferable to have the insulation layer placed on the side of the top plate instead of having it on the middle spring layer. This is because the properties of the middle spring layer needs to be well controlled, and having an insulation layer thereon may impose an unfavorable restriction for such controlling of the properties and behaviors. The insulation layer may either be a contiguous single layer or be patterned. If the middle spring layer itself is made of a dialectical material (e.g., silicon nitride), the insulation layer may be optional.

The primary function of an insulation layer such as the insulation layer 535 is to prevent the shorting between two the electrodes during the cMUT operation. However, using an insulation layer may introduce drawbacks. First, it may trap some charges which may degrade the reliability of the transducer. Second, there exists a voltage drop cross the insulation layer and this voltage drop may reduce the transducer efficiency, especially for a cMUT (e.g. a high frequency cMUT) that needs a small vertical displacement and a high input voltage.

According to one aspect of the present invention, the above drawbacks may be overcome by eliminating the need for the insulation layer 535 using special designs to perform an equivalent function of the insulation layer.

In one design, the depth (vertical height) of the cavity in the substrate wafer is designed to be no greater than, preferably smaller than, the depth (vertical height) of the available transducing space between the top plate and the middle spring layer. In this design, the middle spring layer would be stopped by the bottom of the cavity in the substrate wafer before the conductive top plate and the top electrode hit the bottom electrode to cause shorting between two electrodes. This would effectively prevent the top plate layer from touching the bottom electrode to cause a short, and thus eliminate the need for an insulation layer under the top plate layer.

If a large depth is desired for the cavity below the middle spring layer, a motion stopper may be introduced in the cavity to achieve a similar function as described below with reference to FIG. 14.

Figure 14:
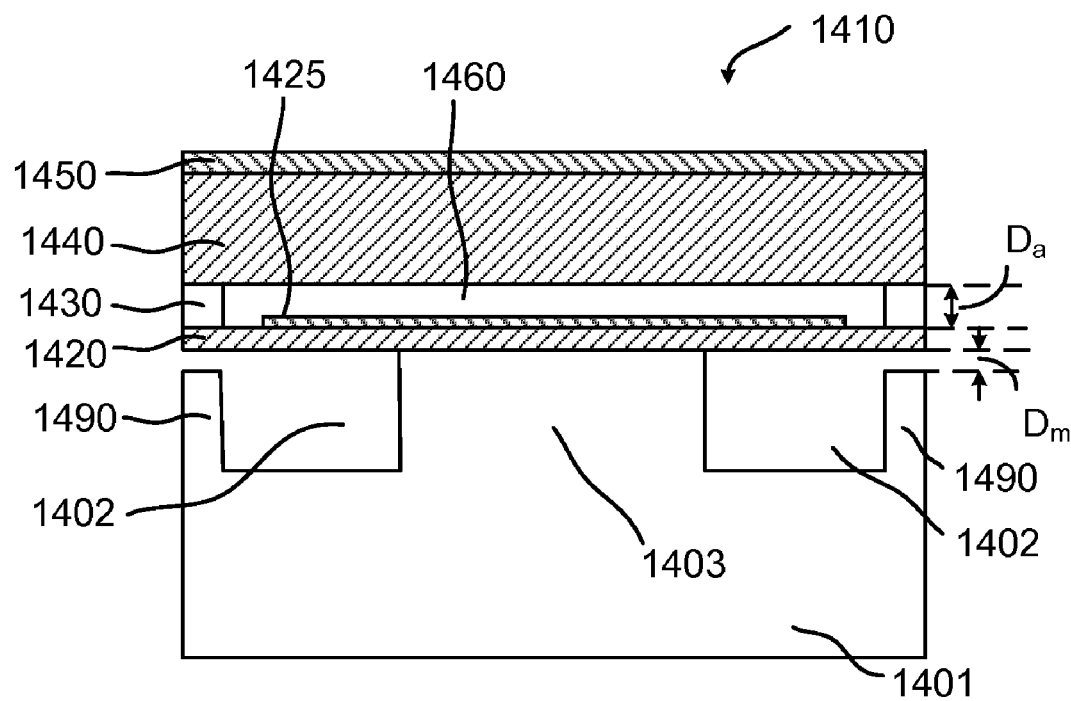
FIG. 14 shows an enlarged view of a selected portion of a cMUT element of the present invention having a motion stopper to limit the maximum vertical displacement of the top plate.

FIG. 14 shows an enlarged view of a selected portion of a cMUT element having a motion stopper to limit the maximum vertical displacement of the top plate. The selected cMUT portion 1410 is similar to the selected cMUT portion 510 in FIG. 5 but has motion stoppers 1490 to prevent shorting. The selected cMUT portion 1410 has two halves centered on an imaginary vertical line (not shown) going through the structure from the top to the bottom. The basic structure of the cMUT element is built on a substrate wafer 1401 and has these components: a cavity 1402 defined by a sidewall anchor 1403, a middle spring layer 1420 which is preferably an elastic membrane, a bottom electrode 1425 placed on the middle spring layer 1400, a connector 1430 which stands on top of the middle spring layer 1420, a top plate 1440, and a top electrode 1450. Unlike the cMUT structure in FIGS. 5A-5B, there is no intervening insulation layer between the top plate layer 1440 and the connector 1430.

The connector 1430 stands out from the middle spring layer 1420 to define a transducing space 1460 below the top plate layer 1440. In this particular embodiment, the actual height $D_a$ of the transducing space 1460 is reduced by the thicknesses of the bottom electrode 1425 and the middle spring layer 1420 in the configuration shown in FIG. 14. The connector 1430 is horizontally distanced from the sidewall anchor 1403 by a sufficient length to define a cantilever anchored at the sidewall anchor 1403. The cantilever and the cavity 1402 enable a vertical displacement of the connector 1430, which transports the top plate 1440 substantially vertically with a piston-like motion, thus changing the transducing space 1460. When the both halves of the cMUT structure 1410 move in the same phase, the vertical piston-like motion is further assured.

As shown in FIG. 14, the maximum vertical displacement $D_m$ of the connector 1430 is limited by a motion stopper 1490 disposed in the cavity 1402. When $D_m$ is designed to be no greater than (preferably smaller than) $D_a$, the vertical displacement of the connector 1430 (and thus the maximum vertical transportation distance of the top plate layer 1440) is limited to be less than the height $D_a$ of the transducing space. This effectively prevents the top plate layer 1440 from touching the bottom electrode 1425 to cause a short, thus eliminating the need for an insulation layer under the top plate layer 1440. In one preferred embodiment, $D_m$ is at least one third less than $D_a$.

The stopper 1490 can be placed at different locations with a desired height. In addition, as in the other designs described herein, the bottom electrode 1425 is optional if the substrate wafer 1401 and/or at least a part of the middle spring layer is conductive.

In general, if the substrate wafer and the middle spring layer are conducted, these layers should preferably be connected together electrically (e.g. to have the same electric potential). Alternatively, either the substrate wafer or the middle spring layer, or both, may be made of insulation materials.

Ideally, the top plate should be light (i.e., with less mass) and rigid. An acoustic ratio of 1st resonant frequency over the total mass, defined as a rigidity/mass ratio, of the top plate may be used to evaluate the material selection and structure design of the top plate. A higher value of the rigidity/mass ratio is generally preferred for the top plate. Several different designs considerations are described below.

(1) If the top plate is made of a solid plate of a single material, the selected material itself should have a low mass density and high Young's modulus (e.g., diamond is one of the best materials for such a purpose).

(2) If a certain material is already selected for the top plate, some structure designs may be used to further improve the rigidity/mass ratio. For example, making a material porous usually increases the rigidity/mass ratio defined above. Porous silicon can be formed by electrochemical etching of silicon in an HF rich electrolyte. For another example, the top plate can be micromachined to have a well-designed hollow structure to achieve a larger ratio of 1st resonant frequency over the total mass. The micromachining may be done by etching with a desired mask pattern.

(3) For a given material, certain treatments can be introduced to increase the equivalent Young's modulus of the materials without increasing the mass. One possible way to do this is to introduce a tension stress in the materials. For example, the stress can be introduced in a thin film formation by controlling the process parameters; the stress can also be introduced into silicon by proper doping if the silicon is used.

The above considerations and methods may be also applied to the materials of the middle spring layer.

Both the top plate and the middle spring layer may be micromachined structures such as a porous structure to achieve modified mechanical properties. For example, the top plate may be made of plates with holes built therein. Alternatively, the holes may be half-through cavities formed on top of the top plate without penetrating the entire thickness thereof. Hollow structures such as voids may also be formed within the top plate with no openings or only very small openings on the surface of the top plate.

FIGS. 15A-15D illustrate examples of holed or hallowed structures applied to the top plate to optimize the properties such as the rigidity/mass ratio of the top plate.

Figure 15A:
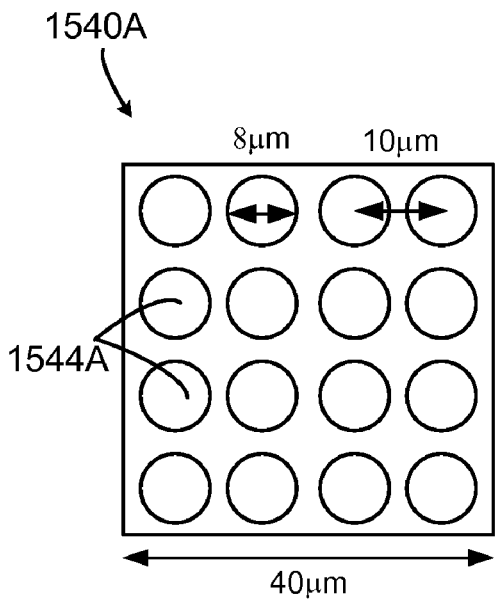
FIGS. 15A-15C show three exemplary configurations of the top plate layer.
Figure 15B:
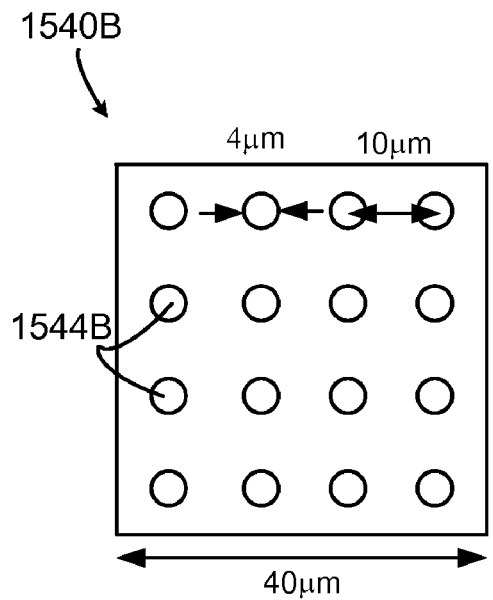
Figure 15C:
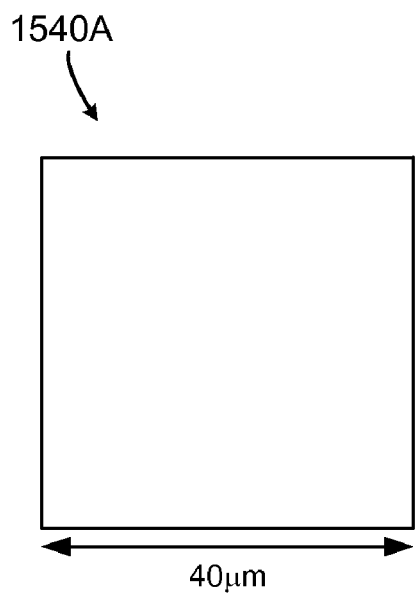
Figure 15D:
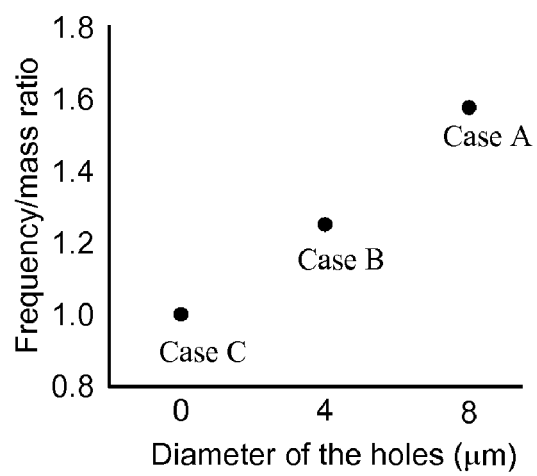
FIG. 15D shows a graph of the corresponding ratio of 1st resonant frequency over the total mass of the top plate as the function of the diameter of the etched holes shown in the three configurations.

FIGS. 15A-15C show three exemplary configurations of a top plate layer of the present invention. FIG. 15D shows a graph of the corresponding ratio of 1st resonant frequency over the total mass of the top plate as the function of the diameter of the etched holes in the three configurations. In the first configuration shown in FIG. 15A, an array of holes 1544A of a diameter of 8 µm is formed on the top plate 1540A. There is a separation distance of 10 µm between the neighboring holes. In the second configuration shown in FIG. 15B, an array of holes 1544B of a diameter of 4 µm is formed on the top plate 1540B. There is a separation distance of 10 µm between the neighboring holes. In the third configuration shown in FIG. 15C, a solid top plate 1540C without holes formed therein is used.

As shown in the graph of FIG. 15D, the first configuration shown in FIG. 15A is a preferred top plate design because it demonstrates the highest rigidity/mass ratio. In these figures, the results of the ratios for three different silicon structure designs for the top plate are normalized by that of a solid silicon plane.

Figure 15E:
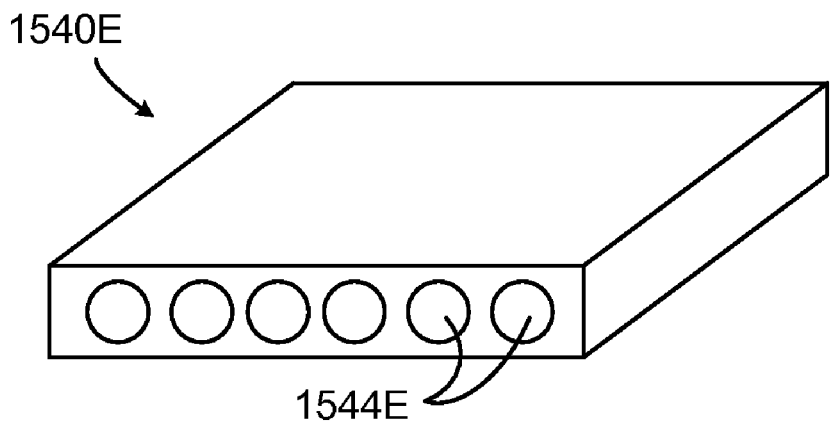
FIG. 15E shows another example of the top plate having holes built therein.

The hollow structures shown in FIGS. 15A-15C are just some examples. It is appreciated that many other possible hollow structure patterns (e.g., hexagon, square, or triangle), with the different shapes, sizes, densities and configurations of the trenches, can be used for the purpose of the present invention. FIG. 15E, for example, shows another example of the top plate having holes built therein. The top plate 1540E has holes 1544E that are built from a side instead of a major surface (e.g. the top surface) of the top plate 1540E.

If needed, the hollow structure can be designed such that the holes may be refilled or sealed using materials with desired properties (e.g., a light and stiff material).

In general, it is preferred that the top plate is significantly more rigid than the middle spring layer and is substantially unbent when transported by the vertical displacement of the connector(s). For example, if the same or similar materials are used for both the top plate layer and the middle spring layer, the top plate layer may desirably be at least three times as thick as the middle spring layer, and more preferably at least five times as thick.

In a capacitance micromachined ultrasonic transducer (cMUT), the bottom electrode may be either on the middle spring layer or on the substrate wafer. In the present description, the term "on" does not necessarily suggest that a separate material or layer is placed on another layer. The bottom electrode may be a part of the middle spring layer or the substrate wafer. For example, the middle spring layer may comprise a conductive material to effectuate the bottom electrode.

In one embodiment, multiple addressable device elements are fabricated on the same substrate wafer. If the substrate wafer is a conductive wafer, the multiple addressable device elements may be insulated from each other by an embedded insulator formed on the substrate wafer. Insulators and the methods of fabricating the same as disclosed in the several patent applications identified herein filed by the common applicant on even date may be useful this purpose. For example, the embedded insulator may have an insulation cavity having a desired overall thickness and being filled with a dielectric material. The embedded insulator may alternatively have a patterned cavity containing solid lines of oxidized native material of the substrate wafer. Similar embedded insulators may be formed on the top plate layer.

The micro-electro-mechanical transducer of the present invention may use various addressing schemes to address the addressable device elements described herein. In particular, the addressable device elements may be addressed from back side of the substrate wafer via a through-wafer interconnect formed through the substrate wafer, as disclosed in the several patent applications identified herein filed by the common applicant on even date. For example, a conductive substrate wafer may be used, and the through-wafer interconnect having an annular trench surrounding a through-wafer conductor made of a native material of the conductive wafer may be used for interconnecting the multiple transducer elements. The through-wafer interconnect may further comprise a dielectric material filled into the annular trench to insulate the through-wafer conductor from rest of the substrate wafer. In one embodiment, the through-wafer conductor is positioned directly underneath the addressable device element.

Although the micro-electro-mechanical transducer of the present invention has been illustrated mostly using a cMUT as an example, other types of transducers such as pMUT and mMUT can also be formed using the same concept in accordance with the present invention.

Figure 16:
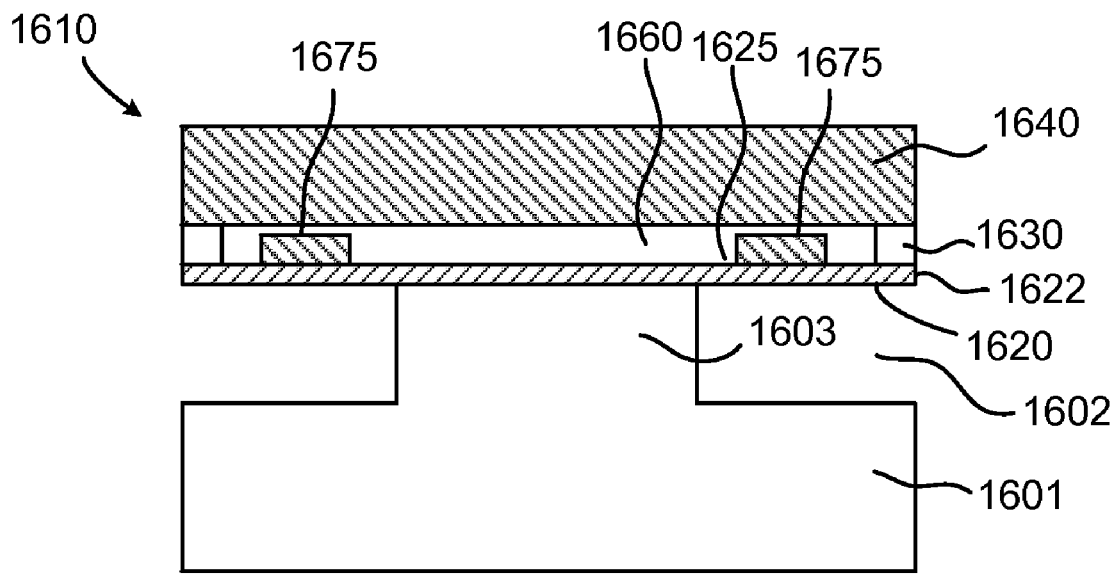
FIG. 16 shows the cross-section view of a section of a pMUT element according to an exemplary embodiment of the present invention.

FIG. 16 shows the cross-section view of a section of a pMUT element according to an exemplary embodiment of the present invention. The pMUT is similar to the cMUT illustrated herein, and has substrate wafer 1601, cavities 1602, sidewall anchors 1603, middle spring layer 1620, plate-spring connectors 1630, top plate 1640, and piezoelectric members 1675 placed on the middle spring layer 1620. Unlike cMUT, the pMUT structure does not have electrodes to form a capacitor having a static electrode and a movable electrode. Instead, a piezoelectric member 1675 function as a transducing member in combination with the cantilevers formed from the resilient middle spring layer 1620. Each piezoelectric member 1675 may include two electrodes sandwiching a piezoelectric layer therebetween. Despite the similarities in the overall structure, the material selection may be different for pMUT because the electric connections in the pMUT transducer are different due to a different energy transformation method.

Figure 17:
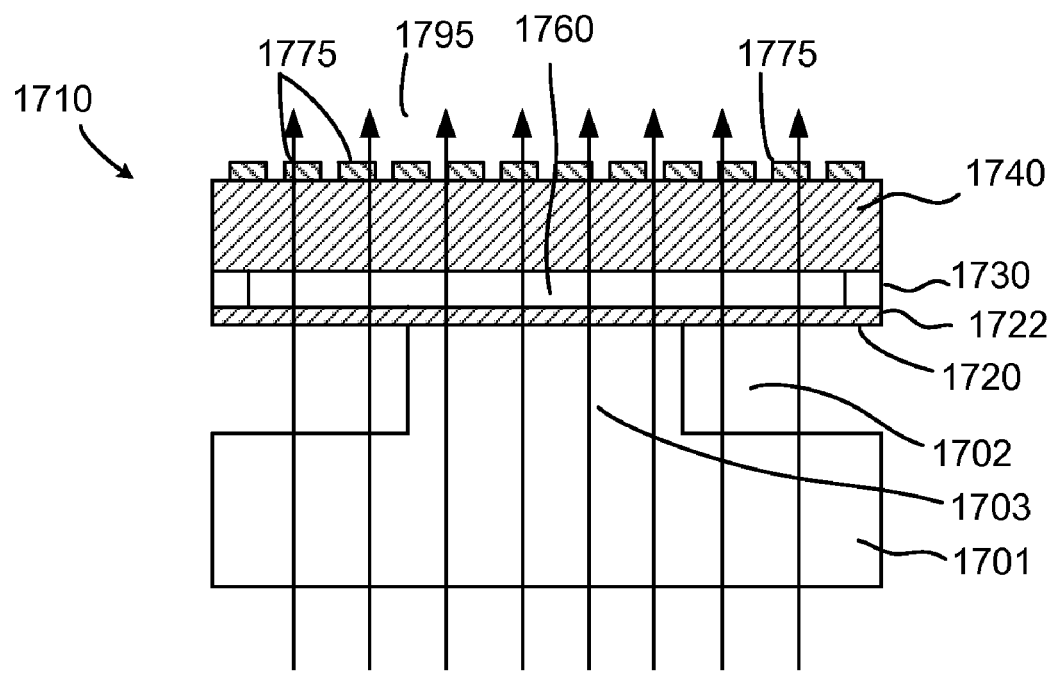
FIG. 17 shows the cross-section view of a section of a mMUT element according to an exemplary embodiment of the present invention.

FIG. 17 shows the cross-section view of a section of a mMUT element according to an exemplary embodiment of the present invention. The mMUT is similar to the cMUT are pMUT illustrated herein, and has substrate wafer 1701, cavities 1702, sidewall anchors 1703, middle spring layer 1720, plate-spring connectors 1730, top plate 1740, and magnetic members 1775 placed on the top plate layer 1740. Unlike cMUT, the mMUT structure does not have electrodes to form a capacitor. Magnetic members 1775 function as a transducing member or energy exchanger activating the top plate in response to the substantially vertical motion of the top plate layer 1740 caused by the cantilevers formed out of the resilient middle spring layer 1720. Despite the similarities in the overall structure, the material selection may be different for mMUT because the electric connections in the mMUT transducer are different due to a different energy transformation method.

Figure 18:
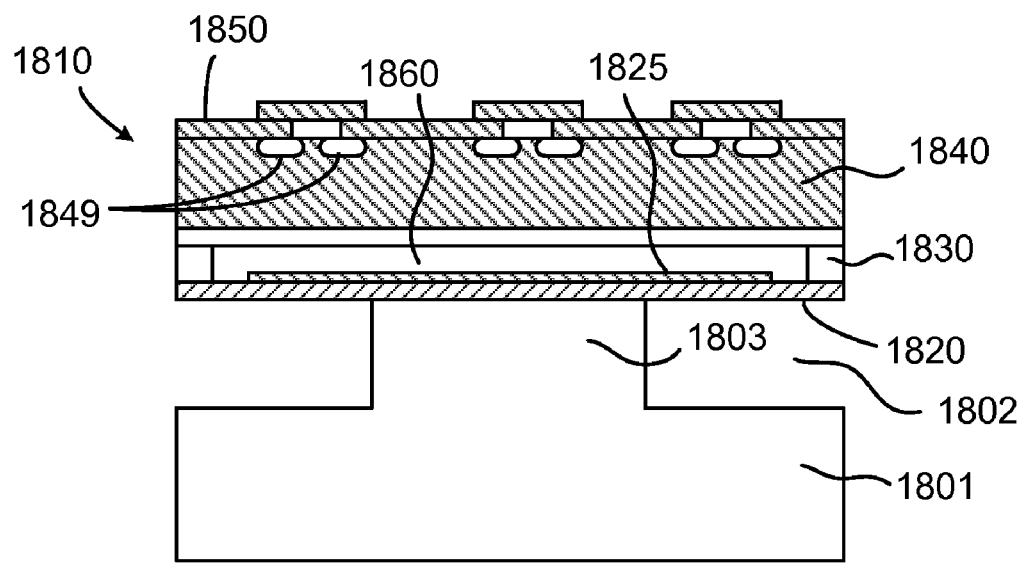
FIG. 18 shows a cross-section view of a cMUT integrated with an IC in accordance with the present invention.

The basic structure of the micro-electro-mechanical transducer described herein may be integrated with integrated circuits (IC). FIG. 18 shows a cross-section view of a cMUT integrated with an IC. The cMUT 1800 includes substrate wafer 1801, cavities 1802, sidewall anchors 1803, middle spring layer 1820, plate-spring connectors 1830, top plate 1840, top electrode 1850, bottom electrode 1825, and integrated circuits 1849 built in the top plate 1840. Metallization may be used to form the top electrode 1850 of the cMUT 1800 and to connect nearby cMUT elements with ICs.

Since the top plate 1840 can be made of single crystal silicon with desired properties (e.g. orientation, doping level and type and the thickness, etc), integrated circuits (IC) 1849 can be fabricated directly on the top plate layer 1840 to accomplish the integration as shown in FIG. 18. The ICs 1849 may be fabricated right after the formation or placement of the tops of his plate 1840. At that stage of the process, the surface of the fabricated wafer with embedded transducers is the bare surface of the top plate layer 1840 which is almost the same as that of a prime wafer. Therefore ICs 1849 can be fabricated by the standard IC fabrication methods. The process after the ICs 1849 have been fabricated should be carefully chosen so that the IC will not be damaged by the subsequent process (e.g., temperature and enchant). Usually, after forming or placing the top plate 1840, no high-temperature process may be required to complete the fabrication of the transducer in order to make the integration feasible.

The ICs 1849 may be fabricated on the top of the cMUT top plate 1840 within the device element area as shown, or fabricated in an adjacent area on the top plate 1840 outside of the device element area (not shown), such as an area between two device elements reserved for IC fabrication.

Alternatively, a wafer with desired ICs preformed can be introduced and bonded with the cMUT wafer during the transducer fabrication to achieve integration. The process after introducing the ICs wafer should be carefully selected to avoid of damaging ICs during the rest process steps.

The micro-electro-mechanical transducer of the present invention may be fabricated using the fabrication methods described in the several patent applications identified herein filed by the common applicant on even date. The fabrication methods for making the basic micro-electro-mechanical transducer of the present invention include (1) Fabrication using wafer-bonding technology; (2) Fabrication Using sacrificial technology; and (3) Fabrication using a combination of wafer-bonding and sacrificial technologies.

The design and fabrication of connections and interconnections disclosed in the several patent applications identified herein may also be used, in addition to any other available designs and methods of interconnections.

The trenches between the micro-electro-mechanical transducer elements may need to be sealed in some applications. For example, a sealing structure may help prevent the medium or moistures leaking into the trench. A sealing structure may also be designed to minimize coupling between elements and to provide electrical connections between the elements. The trenches may be sealed either during or after the device fabrication. Techniques for sealing trenches between the device elements disclosed in the several patent applications identified herein may be used.

The micro-electro-mechanical device such as the cMUT of the present invention may need to interconnect to the outside through bonding wires or the probes. To do this, electrical interface pads (e.g., wire-bonding pads or probing pads) may be needed. The interface pads usually would introduce some undesired parasitic parameters (e.g., parasitic capacitance, or inductance). In order to improve the transducer performance, the parasitic parameters may need to be minimized.

In addition to any available methods for reduction of parasitic capacitance, the novel methods to reduce parasitic capacitance of an interconnection pad by increasing the thickness of an insulator underneath the interconnection pad disclosed in the several patent applications identified herein may also be used. The method allows the thickness of insulation layer on the substrate to be defined by the etching depth instead of the thickness of a film deposition, thus making possible to fabricate insulators of a thickness significantly greater than what would be possible with film deposition techniques.

The micro-electro-mechanical transducer in accordance with the present invention has been described in detail along with the figures and exemplary embodiments. The transducer potentially can alleviate or eliminate a number of problems with existing technology. The invention has eliminated the necessity of forming an addressable transducer element using a great number of smaller cells. Using the technology, either a much fewer cells are just a single cell may be necessary for each addressable transducer element. The design of the micro-electro-mechanical transducer of the present invention is particularly suitable for application in capacitance micromachined ultrasonic transducers (cMUT), but can also be used for other micro-electro-mechanical devices which have a movable mechanical part to transform energy.

In particular, the micro-electro-mechanical transducer in accordance with the present invention may be fabricated using the novel fabrication methods disclosed in international patent applications PCT/IB2006/051566, entitled THROUGH-WAFER INTERCONNECTION; PCT/IB2006/051567, entitled METHODS FOR FABRICATING MICRO-ELECTRO-MECHANICAL DEVICES; and PCT/IB2006/051569, entitled MICRO-ELECTRO-MECHANICAL TRANSDUCERS.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. We claim all such modifications and variations that fall within the scope and spirit of the claims below. The specification and drawings are, accordingly, to be regarded as illustrative rather than restrictive. It will be recognized that the terms "comprising," "including," and "having," as used herein, are specifically intended to be read as open-ended terms of art.

The invention claimed is:

1. A micro-electro-mechanical transducer having a movable mechanical part to transform energy, the transducer comprising an addressable device element having a device element periphery defining a device element area, wherein the addressable device element comprises:
    a substrate;
    a top plate layer disposed above the substrate; and
    a resilient structure between the substrate and the top plate layer, wherein:
    the resilient structure has a lower portion connecting to the substrate and an upper portion connecting to the top plate layer;
    the upper portion of the resilient structure has a plurality of connectors connecting to the top plate layer;
    the plurality of connectors are distributed over the device element area and have at least one connector located substantially away from the device element periphery toward an inner region of the device element area;
    the top plate layer is located over the connectors to define a transducing space below the top plate layer;
    the addressable device element has at least one transducing member to induce energy transformation; and
    the resilient structure enables a vertical displacement of the plurality of connectors to transport the top plate layer in a substantially vertical direction, thus changing the transducing space and activating the transducing member, wherein:
    the transducer comprises a plurality of the addressable device elements; and
    the plurality of addressable device elements are separated by a separation trench formed into at least part of the top plate layer.

2. The micro-electro-mechanical transducer of claim 1, wherein the resilient structure comprises a middle spring layer placed over the substrate, the middle spring layer and the substrate defining at least one cavity inside the device element area, the cavity dividing the device element area into at least two opposing sides, at least one side having an anchor anchoring the middle spring layer, and wherein the plurality of connectors are each horizontally distanced from the anchor by a sufficient length to define a cantilever between the connector and the anchor.

3. The micro-electro-mechanical transducer of claim 2, wherein the top plate is placed over the plurality of connectors, each connector having a desired height standing from the top of the middle spring layer to separate the top plate from the middle spring layer to define the transducing space below the top plate layer.

4. The micro-electro-mechanical transducer of claim 2 wherein the substrate and the middle spring layer define a plurality of cavities dividing the device element area into segments each substantially smaller than the device element area.

5. The micro-electro-mechanical transducer of claim 4 wherein the plurality of cavities comprises a first plurality of extended cavities dividing the device element area into a plurality of islands, and wherein at least some of the islands anchor the middle spring layer.

6. The micro-electro-mechanical transducer of claim 5 wherein the first plurality of extended cavities comprises straight cavities that are substantially parallel to each other.

7. The micro-electro-mechanical transducer of claim 5 wherein the first plurality of extended cavities comprises circular cavities.

8. The micro-electro-mechanical transducer of claim 5 wherein the first plurality of extended cavities comprise circular cavities of decreasing sizes each containing the circular cavities of smaller sizes.

9. The micro-electro-mechanical transducer of claim 5 wherein the first plurality of extended cavities comprising circular cavities of similar sizes arranged side-by-side.

10. The micro-electro-mechanical transducer of claim 5 wherein the plurality of cavities comprises a second plurality of extended cavities, and wherein the second plurality of extended cavities crosses the first plurality of extended cavities to form a grid of cavities defining a plurality of discrete islands, wherein at least some of the plurality of discrete islands anchor the middle spring layer.

11. The micro-electro-mechanical transducer of claim 2 wherein the substrate has a plurality of discrete simple cavities arranged side-by-side.

12. The micro-electro-mechanical transducer of claim 11 wherein each discrete simple cavity divides the substrate into a respective inner island and a common outer portion.

13. The micro-electro-mechanical transducer of claim 2 wherein the at least one cavity and the corresponding anchor(s) together occupy at least half of the device element area.

14. The micro-electro-mechanical transducer of claim 2 wherein in the addressable device element the middle spring layer is a contiguous layer covering the at least one cavity and the corresponding anchor(s).

15. The micro-electro-mechanical transducer of claim 2 wherein the middle spring layer is a contiguous layer covering substantially the entire device element area.

16. The micro-electro-mechanical transducer of claim 2 wherein at least one cavity has an annular shape dividing the device element area into an inner island and an outer region.

17. The micro-electro-mechanical transducer of claim 16 wherein the inner island anchors the middle spring layer.

18. The micro-electro-mechanical transducer of claim 16 wherein both the inner island and the outer region anchor the middle spring layer.

19. The micro-electro-mechanical transducer of claim 2 wherein the two opposing sides of at least one cavity are two opposing anchors each anchoring the middle spring layer.

20. The micro-electro-mechanical transducer of claim 19 wherein at least one connector is located between the two opposing anchors and horizontally distanced from each of the two opposing anchors by a sufficient length to define two cantilevers connected head-to-head.

21. The micro-electro-mechanical transducer of claim 2 wherein the cavity has an annular shape, the middle spring layer covers the entire cavity, and the at least one connector is disposed around the annular shape directly above a middle area of the cavity to define a two-dimensional plane cantilever.

22. The micro-electro-mechanical transducer of claim 1 wherein the plurality of connectors define a connector density profile indicating an average connector density per area location, and the resilient structure has a spring strength corresponding to each connector as an exerting point, wherein the average connector density and the spring strength combinedly define an effective spring intensity profile indicating spring strength per area location.

23. The micro-electro-mechanical transducer of claim 22 wherein the effective spring intensity is substantially uniform over the device element area.

24. The micro-electro-mechanical transducer of claim 22 wherein the effective spring intensity is significantly higher at area locations near a center of the device element area than locations near a perimeter of the device element area.

25. The micro-electro-mechanical transducer of claim 22 wherein the device element area comprises a first region and a second region, the first region having a first thickness of the top plate layer and a first effective spring intensity, and the second region having a second thickness of the top plate layer and a second effective spring intensity, the second thickness being smaller than the first thickness and the second effective spring intensity being less than the first effective spring intensity.

26. The micro-electro-mechanical transducer of claim 22 wherein the device element area comprises a perimeter surrounding a middle region, wherein the top plate layer is flexible near the perimeter, but rigid in the middle region, clamped at a perimeter sidewall and supported by at least one cantilever in the middle region.

27. The micro-electro-mechanical transducer of claim 1 wherein in the addressable device element the top plate layer has a thickness profile having at least two different thicknesses across the device element area.

28. The micro-electro-mechanical transducer of claim 27 wherein the at least two different thicknesses comprise a first thickness corresponding to a normal thickness of the top plate layer and a second thickness corresponding to a bottom thickness of a cavity formed on the top plate layer, the first thickness and the second thickness regularly alternating across the device element area.

29. The micro-electro-mechanical transducer of claim 1 wherein the top plate layer comprises a first material and a second material different from the first material.

30. The micro-electro-mechanical transducer of claim 29 wherein the first material comprises a plurality of segments divided by separation trenches and the second material spans over the trenches to mechanically connect segments and/or at least partially fills the separation trenches.

31. The micro-electro-mechanical transducer of claim 1 which is a capacitance micromachined ultrasonic transducer (cMUT), wherein the addressable device element has a top electrode on the top plate layer and a bottom electrode on either the resilient structure or the substrate.

32. The micro-electro-mechanical transducer of claim 31 wherein resilient structure comprises a middle spring layer, and the bottom electrode is on the middle spring layer.

33. The micro-electro-mechanical transducer of claim 32 wherein the middle spring layer comprises a conductive material to effectuate the bottom electrode.

34. The micro-electro-mechanical transducer of claim 31 wherein the top electrode is a separate conductive layer deposited on the top plate layer.

35. The micro-electro-mechanical transducer of claim 1 which is a pMUT, wherein the transducing member comprises a piezoelectric member disposed on the top plate or the middle spring layer.

36. The micro-electro-mechanical transducer of claim 1 which is a mMUT, wherein the transducing member comprises a magnetic member disposed on the top plate layer.

37. The micro-electro-mechanical transducer of claim 1 wherein the top plate layer comprises holes formed therein.

38. The micro-electro-mechanical transducer of claim 37 wherein the holes have a size and location profile optimized for a desired rigidity/mass ratio of the top plate layer.

39. The micro-electro-mechanical transducer of claim 1 wherein the vertical displacement of the connector is limited to a maximum displacement no greater than the height of the transducing space.

40. The micro-electro-mechanical transducer of claim 39 wherein the maximum displacement of the connector is at least one third smaller than the height of the transducing space.

41. The micro-electro-mechanical transducer of claim 39 wherein the maximum vertical displacement of the connector is limited by a motion stopper disposed in the cavity.

42. The micro-electro-mechanical transducer of claim 1 wherein the top plate is significantly more rigid than the resilient structure and is substantially unbent when transported by the vertical displacement of the connector(s).

43. A micro-electro-mechanical transducer having a movable mechanical part to transform energy, the transducer comprising:
   a substrate, a middle spring layer and a top plate layer arranged in that order such that a bottom side of the top plate layer faces a top side of the middle spring layer and a bottom side of the middle spring layer faces a front side of the substrate, wherein the transducer comprises at least one addressable device element defining a device element area of the substrate and a corresponding device element area of the top plate layer, each addressable device element having a transducing member and being further characterized in that:

the device element area has at least one cavity between the substrate and the middle spring layer, each cavity being sidewalled by at least one anchor anchoring the middle spring layer;

the middle spring layer covers at least a part of each cavity;

at least one connector of a desired height is disposed above each cavity, the connector standing from the top of the middle spring layer;

the top plate is placed over the connector(s) to define a transducing space below the top plate layer, the top plate layer including a first electrode and at least a portion of the middle spring layer serving as at least a portion of a second electrode;

each connector is horizontally distanced from one of the at least one anchor by a sufficient length to define a cantilever between the connector and the anchor, wherein the cantilever and the cavity enable a vertical displacement of the connector to transport the top plate layer substantially vertically, thus changing the transducing space and activating the transducing member; and the at least one anchor is conductive to serve as a conductor to access the second electrode.

44. The micro-electro-mechanical transducer of claim 43, wherein at least one cavity is in an inner area of the substrate and divides the substrate into at least two segments.

45. The micro-electro-mechanical transducer of claim 43 wherein at least one cavity has an annular shape dividing the substrate into an inner island and an outer region.

46. The micro-electro-mechanical transducer of claim 43 wherein the cavity is sidewalled by two opposing anchors each anchoring the middle spring layer, and the at least one connector is located between the two opposing anchors and horizontally distanced from each of the two opposing anchors by a sufficient length to define a bridge containing two cantilevers connected head-to-head.

47. The micro-electro-mechanical transducer of claim 43 wherein the cavity has an annular shape, the middle spring layer covers the entire cavity, and the at least one connector is disposed around the annular shape directly above a middle area of the cavity to define a two-dimensional plane cantilever.

48. A micromachined ultrasonic transducer (MUT) structure comprising:

a substrate, a middle spring layer and the top plate layer arranged in that order such that a bottom side of the top plate layer faces a top side of the middle spring layer and a bottom side of the middle spring layer faces a front side of the substrate, wherein the MUT structure comprises a plurality of addressable MUT elements each defined by a MUT element area of the substrate and a corresponding MUT element area of the top plate layer, each of the plurality of addressable MUT elements having a transducing member and being further characterized in that:

the MUT element area has at least one cavity between the substrate and the middle spring layer, each cavity being sidewalled by at least one anchor anchoring the middle spring layer;

the middle spring layer covers at least a part of each cavity;

at least one connector of a desired height disposed above each cavity, the connector standing from the top of the middle spring layer;

the top plate is placed over the connector(s) to define a transducing space below the top plate layer, the top plate layer including a first electrode;

each connector is horizontally distanced from one of the at least one anchor by a sufficient length to define a cantilever between the connector and the anchor, wherein the cantilever and the cavity enable a vertical displacement of the connector to transport the top plate layer substantially vertically with a piston-like motion, thus changing the transducing space and activating the transducing member; and the substrate including at least a portion of a second electrode.

49. The MUT structure of claim 48 wherein the plurality of addressable MUT elements are separated by a separation trench formed through at least part of the top plate layer.

50. The MUT structure of claim 49 wherein the separation trench is sealed using a sealing material.

51. The MUT structure of claim 50 wherein the sealing material is a sealing layer placed over top of the separation trench.

52. The MUT structure of claim 51, wherein the middle spring layer is a silicon layer, and the bottom electrode comprises a highly doped region on the middle spring layer.

53. The MUT structure of claim 48 wherein the top plate layer comprises holes formed therethrough, the holes having a size and location profile that is optimized for a desired rigidity/mass ratio of the top plate layer.

54. The MUT structure of claim 48 further comprising an integrated circuit built in the top plate layer.

55. The micro-electro-mechanical transducer of claim 43, wherein the substrate is conductive.

56. The micro-electro-mechanical transducer of claim 43, wherein at least one of the substrate or the anchor includes a conductive layer.

57. The MUT structure of claim 48, wherein the substrate is conductive.

58. The MUT structure of claim 48, wherein the at least one anchor is conductive.

59. The MUT structure of claim 48, wherein the substrate includes a conductive layer.

60. The MUT structure of claim 48, wherein the anchor includes a conductive layer.

* * * * *